US012635307B2

(12) United States Patent
Park et al.

(10) Patent No.: US 12,635,307 B2
(45) Date of Patent: May 19, 2026

(54) DISPLAY DEVICE AND METHOD OF MANUFACTURING DISPLAY DEVICE

(71) Applicant: Samsung Display Co., LTD., Yongin-si (KR)

(72) Inventors: Joon Yong Park, Yongin-si (KR); Hyun Eok Shin, Yongin-si (KR); Su Kyoung Yang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 445 days.

(21) Appl. No.: 18/462,455

(22) Filed: Sep. 7, 2023

(65) Prior Publication Data
US 2024/0243231 A1 Jul. 18, 2024

(30) Foreign Application Priority Data
Jan. 12, 2023 (KR) ........................ 10-2023-0004919

(51) Int. Cl.
H10H 20/833 (2025.01)
H01L 25/075 (2006.01)
(Continued)

(52) U.S. Cl.
CPC ....... H10H 20/833 (2025.01); H01L 25/0753 (2013.01); H10H 20/8312 (2025.01); H10H 20/032 (2025.01)

(58) Field of Classification Search
CPC ............. H10H 20/833; H10H 20/8312; H10H 20/032; H10H 20/857; H10H 20/0364;
(Continued)

(56) References Cited

U.S. PATENT DOCUMENTS 11,367,823 B2 6/2022 Kim et al.
2021/0242381 A1* 8/2021 Lee ..................... H01L 25/0753
(Continued)

FOREIGN PATENT DOCUMENTS

KR 10-2021-0098313 8/2021
KR 10-2299992 9/2021
(Continued)

OTHER PUBLICATIONS

Minami, "Transparent and conductive multicomponent oxide films prepared by magnetron sputtering", J. Vac. Sci. Technol. A, Jul. 1999, pp. 1765-1772, vol. 17, No. 4.

*Primary Examiner* — Anne M Hines
*Assistant Examiner* — Jose M Diaz
(74) *Attorney, Agent, or Firm* — CANTOR COLBURN LLP

(57) ABSTRACT

A display device includes electrodes spaced apart from each other, a first insulating layer disposed on the electrodes, a light emitting element disposed on the first insulating layer, and a connection electrode contacting the light emitting element on the light emitting element. The electrodes include a first electrode layer, a second electrode layer, and a third electrode layer. The first electrode layer, the second electrode layer, and the third electrode layer are sequentially stacked. A surface of the second electrode layer includes an Al—Ni—Cu precipitate. The connection electrode contacts the surface of the second electrode layer through a contact hole formed in the third electrode layer.

20 Claims, 21 Drawing Sheets

(51) Int. Cl.
   *H10H 20/01*      (2025.01)
   *H10H 20/831*     (2025.01)
(58) Field of Classification Search
   CPC .............. H10H 20/8506; H10H 29/142; H01L
            25/0753; H01L 24/97; H01L 2924/12041;
            H10K 59/805; H10K 59/122; H10K
            59/123; H10D 86/021; H10D 86/441
   See application file for complete search history.

(56)                References Cited

U.S. PATENT DOCUMENTS

2021/0399069  A1    12/2021  Kim et al.
2023/0128161  A1     4/2023  Song et al.

FOREIGN PATENT DOCUMENTS

KR    10-2021-0124594    10/2021
KR    10-2021-0156909    12/2021

* cited by examiner

DISPLAY DEVICE AND METHOD OF MANUFACTURING DISPLAY DEVICE

CROSS-REFERENCE TO RELATED APPLICATION

This application claims priority to and benefits of Korean Patent Application No. 10-2023-0004919 under 35 U.S.C. § 119, filed in the Korean Intellectual Property Office on Jan. 12, 2023, the entire contents of which are incorporated herein by reference.

BACKGROUND

1. Technical Field

The disclosure relates to a display device and a method of manufacturing the display device.

2. Description of the Related Art

Recently, as interest in an information display is increasing, research and development for a display device are continuously being conducted.

SUMMARY

Embodiments provide a display device capable of minimizing a contact resistance and preventing damage to electrodes.

Embodiments also provide a method of manufacturing a display device, which is capable of minimizing a contact resistance while preventing damage to electrodes.

However, embodiments of the disclosure are not limited to those set forth herein. The above and other embodiments will become more apparent to one of ordinary skill in the art to which the disclosure pertains by referencing the detailed description of the disclosure given below.

According to an embodiment of the disclosure for solving the above-described object, a display device includes electrodes spaced apart from each other, a first insulating layer disposed on the electrodes, a light emitting element disposed on the first insulating layer, and a connection electrode contacting the light emitting element on the light emitting element. The electrodes include a first electrode layer, a second electrode layer, and a third electrode layer. The first electrode layer, the second electrode layer, and the third electrode layer are sequentially stacked. The second electrode layer includes an Al—Ni—Cu precipitate on a surface of the second electrode layer. The connection electrode contacts the surface of the second electrode layer through a contact hole formed in the third electrode layer.

The first electrode layer and the third electrode layer may include a same material.

The first electrode layer and the third electrode layer may include IZO.

The second electrode layer may include about 0.5 at % to about 1.0 at % of Ni, about 0.3 at % to about 1.0 at % of La, about 0.5 at % to about 1.0 at % of Cu, and a balance of Al.

The connection electrode may include ITO.

The connection electrode may contact the surface of the second electrode layer through a contact hole formed in the first insulating layer.

The display device may further include a second insulating layer disposed on the light emitting element, and the connection electrode may contact an end of the light emitting element exposed by the second insulating layer.

The second electrode layer may further include an aluminum oxide film on a surface of the second electrode layer.

A thickness of the first electrode layer and the third electrode layer may be in a range of about 50 Å to about 150 Å.

A thickness of the second electrode layer may be in a range of about 1,000 Å to about 2,000 Å.

According to an embodiment of the disclosure for solving the above-described object, a method of manufacturing a display device includes forming a first electrode layer and a second electrode layer and applying heat, forming a third electrode layer on the second electrode layer, forming a first insulating layer on the third electrode layer, providing a light emitting element on the first insulating layer, forming a contact hole in the third electrode layer and the first insulating layer, and forming a connection electrode on the light emitting element. The connection electrode contacts a surface of the second electrode layer through the contact hole.

An Al—Ni—Cu precipitate may be formed on the surface of the second electrode layer in the applying of the heat.

The method may further include forming a bank on the first insulating layer.

The second electrode layer may be covered by the third electrode layer in the forming of the bank.

The light emitting element may be provided in an opening of the bank.

The light emitting element may be aligned between electrodes including the first electrode layer, the second electrode layer, and the third electrode layer.

The second electrode layer may be covered by the third electrode layer in the forming of the first insulating layer.

The method may further include forming a second insulating layer on the light emitting element, and the second electrode layer may be covered by the third electrode layer in the forming of the second insulating layer.

The connection electrode may contact an end of the light emitting element exposed by the second insulating layer.

The second electrode layer may be formed of an alloy including about 0.5 at % to about 1.0 at % of Ni, about 0.3 at % to about 1.0 at % of La, about 0.5 at % to about 1.0 at % of Cu, and a balance of Al.

Details of other embodiments are included in the detailed description and drawings.

According to the above-described embodiment, a contact resistance may be minimized and damage to electrodes may be prevented. Thus, a heating issue and a luminance reduction in a display device may be improved.

An effect according to embodiments is not limited by the contents illustrated above, and more various effects are included in the specification.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
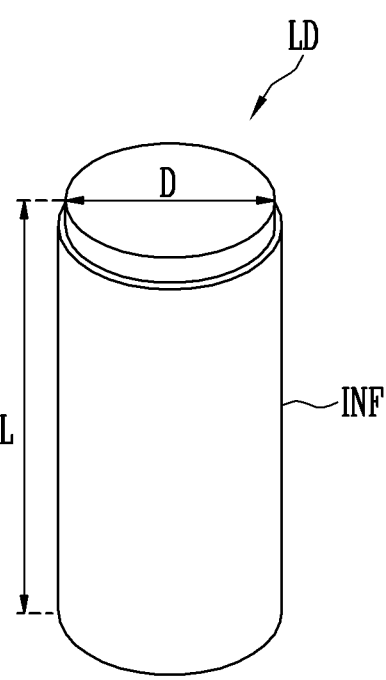
FIG. 1 is a schematic perspective view illustrating a light emitting element according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

The term "coupling" or "connection" may collectively mean a physical and/or electrical coupling or connection. This may collectively mean a direct or indirect coupling or connection and an integral or non-integral coupling or connection.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure are described in detail with reference to the accompanying drawings.

Figure 2:
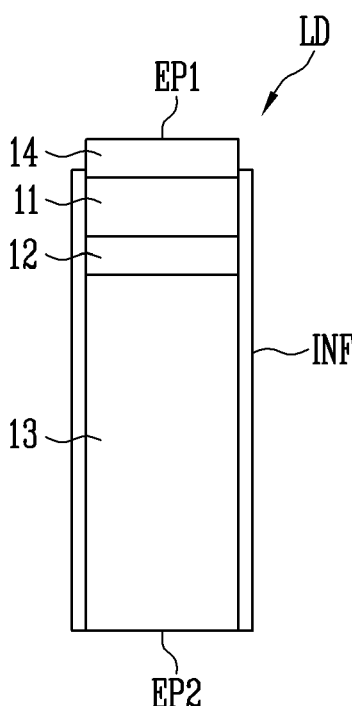
FIG. 2 is a schematic cross-sectional view illustrating a light emitting element according to an embodiment.

FIG. 1 is a schematic perspective view illustrating a light emitting element according to an embodiment. FIG. 2 is a schematic cross-sectional view illustrating a light emitting element according to an embodiment. FIGS. 1 and 2 show a column shape light emitting element LD, but a type and/or a shape of the light emitting element LD are/is not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in a column shape extending in a direction. The light emitting element LD may have a first end EP1 and a second end EP2. One of the first and second semiconductor layers 11 and 13 may be disposed at the first end EP1 of the light emitting element LD. Another of the first and second semiconductor layers 11 and 13 may be disposed at the second end EP2 of the light emitting element LD. For example, the first semiconductor layer 11 may be disposed at the first end EP1 of the light emitting element LD, and the second semiconductor layer 13 may be disposed at the second end EP2 of the light emitting element LD.

According to an embodiment, the light emitting element LD may be a light emitting element manufactured in a column shape through an etching method or the like. In the specification, the column shape of the light emitting element LD may include a rod-like shape or a bar-like shape having an aspect ratio of about 1 or greater. For example, the light emitting element LD may have a circular column or a polygonal column. However, the shape of the cross-section thereof is not limited thereto.

The light emitting element LD may have a size as small as a nanometer scale to a micrometer scale. For example, each light emitting element LD may have a diameter D (or width) and/or a length L in a range of a nanometer scale to a micrometer scale. However, a size of the light emitting element LD is not limited thereto, and the size of the light emitting element LD may be variously changed according to a design condition of various devices (e.g., a display device or the like) including a light emitting device (e.g., the light emitting element LD) as a light source.

The first semiconductor layer 11 may be a semiconductor layer of a first conductivity type. For example, the first semiconductor layer 11 may include a p-type semiconductor layer. For example, the first semiconductor layer 11 may include at least one semiconductor material among InAl-GaN, GaN, AlGaN, InGaN, and AlN, and may include a p-type semiconductor layer doped with a first conductivity type dopant such as Mg. However, a material configuring the first semiconductor layer 11 is not limited thereto, and various other materials may configure the first semiconductor layer 11.

The active layer 12 may be disposed between the first semiconductor layer 11 and the second semiconductor layer 13. The active layer 12 may include any one of a single well structure, a multi well structure, a single quantum well structure, a multi quantum well (MQW) structure, a quantum dot structure, or a quantum wire structure, but is not limited thereto. The active layer 12 may include at least one of GaN, InGaN, InAlGaN, AlGaN, and AlN. However, the disclosure is not limited thereto and various other materials may configure the active layer 12.

In case that a voltage equal to or greater than a threshold voltage is applied to ends (e.g., both ends) of the light emitting element LD, an electron-hole pair may be combined in the active layer 12. Thus, the light emitting element LD may emit light. Emission of the light emitting element LD may be controlled using such a principle, and the light emitting element LD may be used as a light source of various light emitting devices including a pixel of a display device.

The second semiconductor layer 13 may be disposed on the active layer 12 and may include a semiconductor layer of a type different from that of the first semiconductor layer 11. The second semiconductor layer 13 may include an n-type semiconductor layer. For example, the second semiconductor layer 13 may include at least one semiconductor material among InAlGaN, GaN, AlGaN, InGaN, and AlN, and may include an n-type semiconductor layer doped with a second conductivity type dopant including at least one of Si, Ge, and Sn. However, a material configuring the second semiconductor layer 13 is not limited thereto, and various other materials may configure the second semiconductor layer 13.

The electrode layer 14 may be disposed on the first end EP1 and/or the second end EP2 of the light emitting element LD. In FIG. 2, the electrode layer 14 may be formed on the first semiconductor layer 11, but the disclosure is not limited thereto. For example, a separate contact electrode may be further disposed on the second semiconductor layer 13.

The electrode layer 14 may include a transparent metal or a transparent metal oxide. For example, the electrode layer 14 may include at least one of indium tin oxide (ITO), indium zinc oxide (IZO), and zinc tin oxide (ZTO), but is not limited thereto. As described above, in case that the electrode layer 14 is formed of the transparent metal or the transparent metal oxide, light generated in the active layer 12 of the light emitting element LD may pass through the electrode layer 14 and may be emitted to an outside of the light emitting element LD.

An insulating film INF may be provided on a surface of the light emitting element LD. The insulating film INF may be disposed (e.g., directly disposed) on surfaces (e.g., side surfaces) of the first semiconductor layer 11, the active layer 12, the second semiconductor layer 13, and/or the electrode layer 14. The insulating film INF may expose the first and second ends EP1 and EP2 of the light emitting element LD having different polarities. According to an embodiment, the insulating film INF may expose a side portion of the electrode layer 14 and/or the second semiconductor layer 13 adjacent to the first and second ends EP1 and EP2 of the light emitting element LD.

The insulating film INF may electrically insulate the active layer 12 from other conductive materials except for the first and second conductive layers 11 and 13. Thus, the insulating film INF may prevent an electrical short between the active layer 12 and the conductive materials. The insulating film INF may minimize a surface defect of the light emitting elements LD. Thus, lifespan and emission efficiency of the light emitting elements LD may be improved.

For example, the insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). For example, the insulating film INF may be configured as double layers, and each layer configuring the double layers may include different materials. For example, the insulating film INF may be configured as double layers configured of (e.g., respectively configured of) aluminum oxide ($AlO_x$) and silicon oxide ($SiO_x$), but is not limited thereto. According to an embodiment, the insulating film INF may be omitted.

A light emitting device including the light emitting element LD described above may be used in various types of devices (e.g., a display device) that require a light source. For example, the light emitting elements LD may be disposed in each pixel of a display panel, and the light emitting elements LD may be used as a light source of each pixel. However, an application field of the light emitting element LD is not limited to the above-described example. For example, the light emitting element LD may also be used in other types of devices (e.g., a lighting device) that require a light source.

Figure 3:
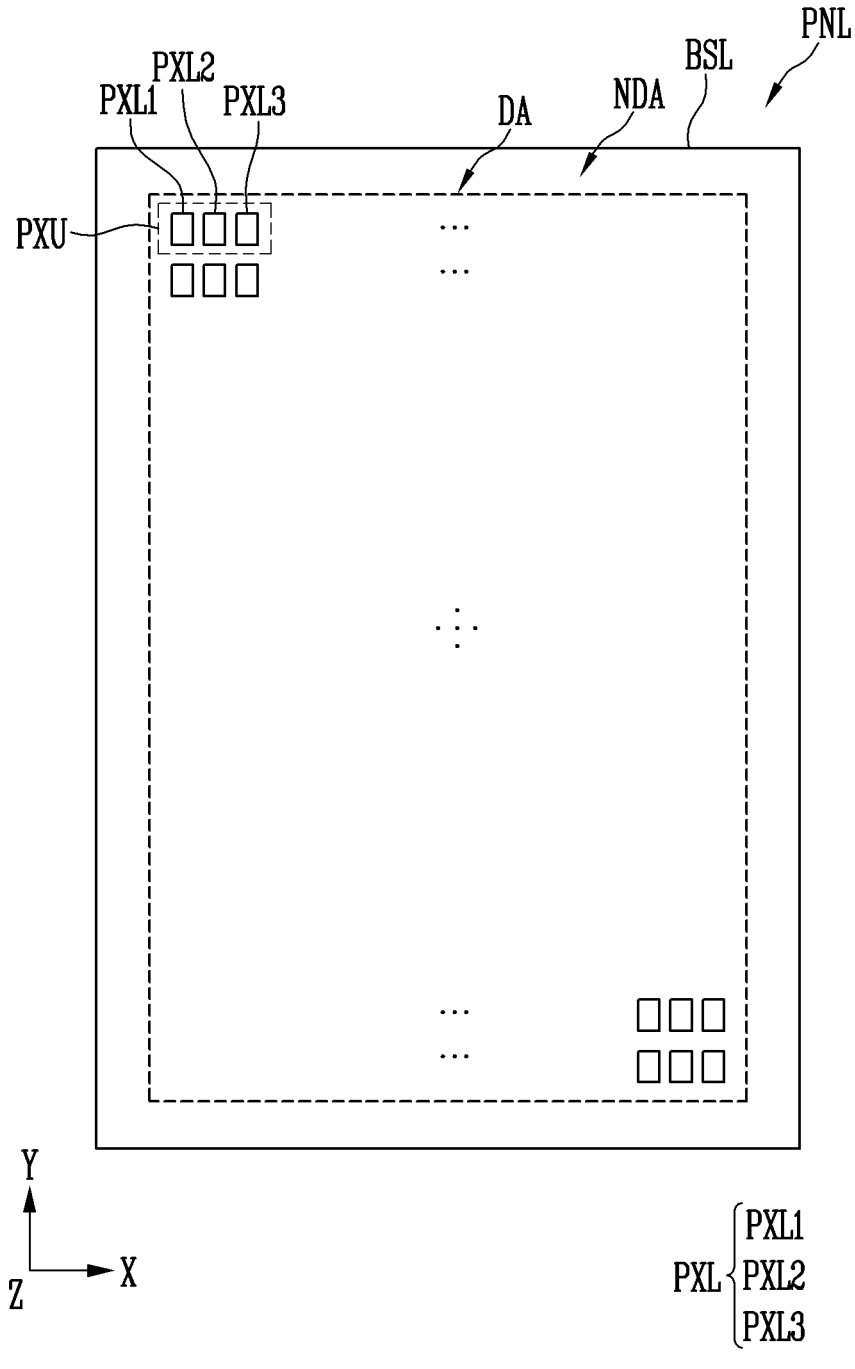
FIG. 3 is a schematic plan view illustrating a display device according to an embodiment.

FIG. 3 is a schematic plan view illustrating a display device according to an embodiment.

In FIG. 3, an electronic device may use the light emitting element LD described in the embodiments of FIGS. 1 and 2 as a light source, and a display panel PNL may be provided in the display device.

For convenience of description, a structure of the display panel PNL may be briefly shown based on a display area DA in FIG. 3. However, according to an embodiment, at least one driving circuit part (e.g., at least one of a scan driver and a data driver), lines and/or pads, which are/is not shown may be further disposed on the display panel PNL.

Referring to FIG. 3, the display panel PNL and a base layer BSL for forming the display panel PNL may include the display area DA for displaying an image and a non-display area NDA except for the display area DA. The display area DA may configure a screen on which the image is displayed, and the non-display area NDA may be an area except for the display area DA. For example, the image may not be displayed on the non-display area NDA.

A pixel part PXU may be disposed in the display area DA. The pixel part PXU may include a first pixel PXL1, a second pixel PXL2, and/or a third pixel PXL3. Hereinafter, when at least one pixel among the first pixel PXL1, the second pixel PXL2, and the third pixel PXL3 is arbitrarily referred to, or when two or more types of pixels are collectively referred to, the at least one pixel or the two or more types of pixels are referred to as a "pixel PXL" or "pixels PXL".

The pixels PXL may be regularly arranged according to a stripe or PENTILE™ arrangement structure, or the like. However, an arrangement structure of the pixels PXL is not limited thereto, and the pixels PXL may be arranged in the display area DA in various structures and/or methods.

According to an embodiment, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged. At least one of the first to third pixels PXL1, PXL2, and PXL3 adjacent to each other may configure a pixel part PXU capable of emitting light of various colors. For example, each of the first to third pixels PXL1, PXL2, and PXL3 may be a pixel emitting light of a color (e.g., a predetermined or selectable color). According to an embodiment, the first pixel PXL1 may be a red pixel emitting red light, the second pixel PXL2 may be a green pixel emitting green light, and the third pixel PXL3 may be a blue pixel emitting blue light. However, the disclosure is not limited thereto.

In an embodiment, the first pixel PXL1, the second pixel PXL2, and the third pixel PXL3 may include light emitting elements that emit light of a same color, and may include a color conversion layer and/or a color filter layer of different colors disposed on the respective light emitting elements. Thus, the first pixel PXL1, the second pixel PXL2, and the third pixel PXL3 may emit light of the first color, the second color, and the third color, respectively. In another embodiment, the first pixel PXL1, the second pixel PXL2, and the third pixel PXL3 may include a light emitting element of the first color, a light emitting element of the second color, and a light emitting element of the third color as a light source, to emit light of the first color, the second color, and the third color, respectively. However, the color, type, number, and/or the like of the pixels PXL configuring each pixel part PXU are/is not limited thereto. For example, the color of light emitted by each pixel PXL may be variously changed.

The pixel PXL may include at least one light source driven by a control signal (e.g., a scan signal and a data signal) and/or power (e.g., first power and second power). In an embodiment, the light source may include at least one light emitting element LD according to any one of the embodiments of FIGS. 1 and 2. For example, the light source of the pixel PXL may include an ultra-small column shape light emitting elements LD having a size as small as a nanometer scale to a micrometer scale. However, the disclosure is not limited thereto, and various types of light emitting elements LD may be used as the light source of the pixel PXL.

In an embodiment, each pixel PXL may be configured as an active pixel. However, a type, a structure, and/or a driving method of the pixel PXL applicable to the display device are/is not limited thereto. For example, each pixel PXL may be configured as a pixel of a passive display device or an active light emitting display device of various structures and/or driving methods.

Figure 4:
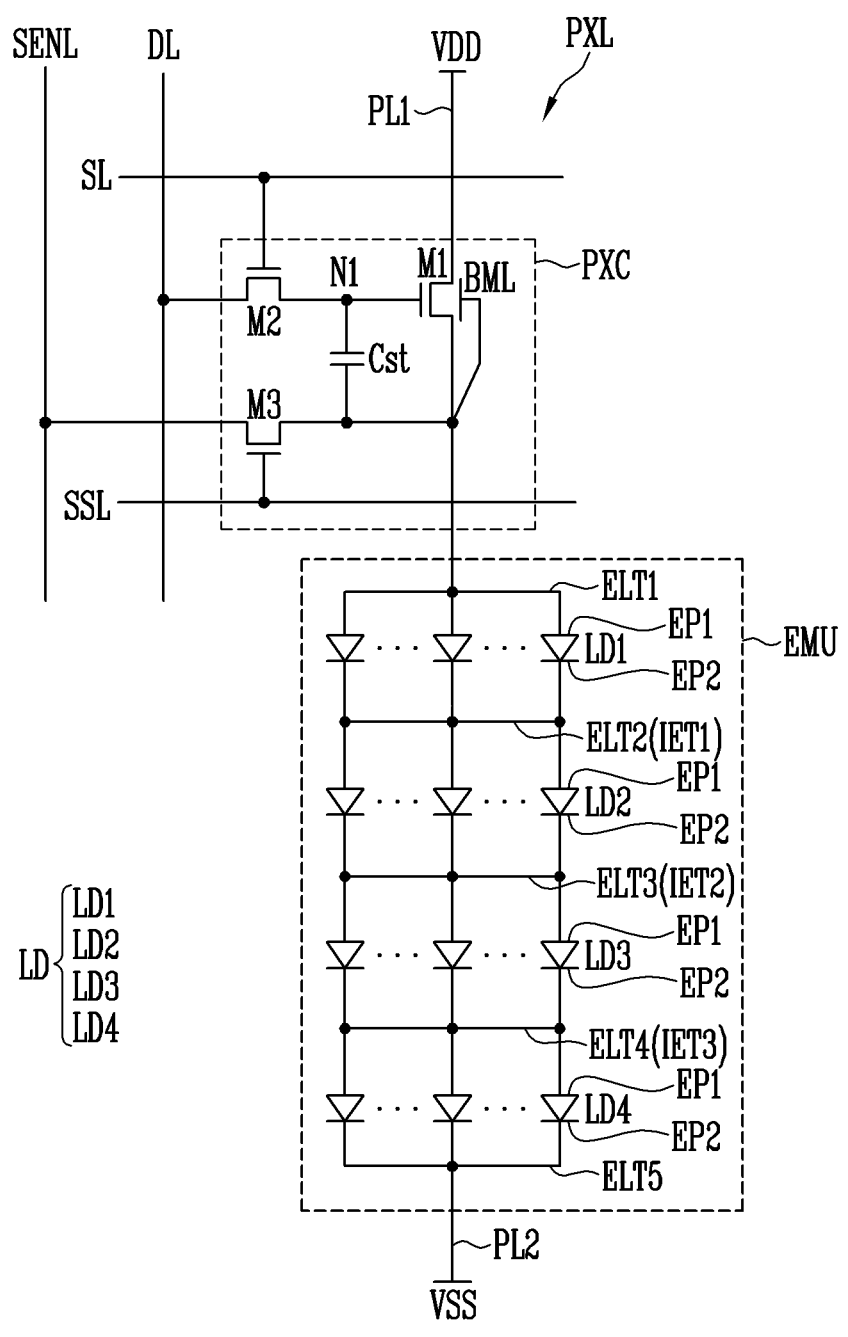
FIG. 4 is a schematic diagram of an equivalent circuit illustrating a pixel according to an embodiment.

FIG. 4 is a schematic diagram of an equivalent circuit illustrating a pixel according to an embodiment.

The pixel PXL shown in FIG. 4 may be any one of the first pixel PXL1, the second pixel PXL2, and the third pixel PXL3 provided in the display panel PNL of FIG. 3. The first pixel PXL1, the second pixel PXL2, and the third pixel PXL3 may have structures substantially identical or similar to each other.

Referring to FIG. 4, each pixel PXL may further include a light emitting part EMU and a pixel circuit PXC. The light emitting part EMU may generate light of a luminance corresponding to a data signal, and the pixel circuit PXC may drive the light emitting part EMU.

The pixel circuit PXC may be electrically connected between first power VDD and the light emitting part EMU. The pixel circuit PXC may be electrically connected to a scan line SL and a data line DL of the corresponding pixel PXL, and may control an operation of the light emitting part EMU in response to a scan signal and a data signal respectively supplied from the scan line SL and the data line DL. The pixel circuit PXC may be further selectively and electrically connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be electrically connected between the first power VDD and a first connection electrode ELT1. A gate electrode of the first transistor M1 may be electrically connected to a first node N1. The first transistor M1 may control a driving current supplied to the light emitting part EMU in response to a voltage of the first node N1. For example, the first transistor M1 may be a driving transistor that controls the driving current of the pixel PXL.

In an embodiment, the first transistor M1 may selectively include a lower conductive layer BML (also referred to as a "lower electrode", a "back gate electrode", or a "lower light blocking layer"). The gate electrode of the first transistor M1 and the lower conductive layer BML may overlap each other with an insulating layer disposed (e.g., interposed) therebetween. For example, the insulating layer may be disposed between the gate electrode and the lower conductive layer BML of the first transistor M1. In an embodiment, the lower conductive layer BML may be electrically connected to an electrode (e.g., a source electrode or a drain electrode) of the first transistor M1.

In case that the first transistor M1 includes the lower conductive layer BML, a back-biasing technology (or sync technology) may be applied to drive the pixel PXL. In the back-biasing technology, a back-biasing voltage may be applied to the lower conductive layer BML of the first transistor M1, and a threshold voltage of the first transistor M1 may move in a negative direction or a positive direction. For example, in a source-sync technology, the lower conductive layer BML may be electrically connected to the source electrode of the first transistor M1, and the threshold voltage of the first transistor M1 may move in the negative direction or the positive direction. In case that the lower conductive layer BML is disposed under a semiconductor pattern configuring a channel of the first transistor M1, the lower conductive layer BML may serve as a light blocking pattern and stabilize an operation characteristic of the first transistor M1. However, a function and/or a utilization method of the lower conductive layer BML are/is not limited thereto.

The second transistor M2 may be electrically connected between the data line DL and the first node N1. A gate electrode of the second transistor M2 may be electrically connected to the scan line SL. In case that a scan signal of a gate-on voltage (e.g., a high level voltage) is supplied from the scan line SL, the data line DL may be electrically connected to the first node N1. Thus, the second transistor M2 may be turned on.

For each frame period, a data signal of a corresponding frame may be supplied to the data line DL, and the data signal may be transmitted to the first node N1 through the turned on second transistor M2 during a period in which the scan signal of the gate-on voltage is supplied. For example, the second transistor M2 may be a switching transistor for transmitting each data signal to an inside of the pixel PXL.

An electrode of the storage capacitor Cst may be electrically connected to the first node N1, and another electrode of the storage capacitor Cst may be electrically connected to the second electrode of the first transistor M1. The storage capacitor Cst may charge a voltage corresponding to the data signal supplied to the first node N1 during each frame period.

The third transistor M3 may be electrically connected between the first connection electrode ELT1 (or the second electrode of the first transistor M1) and the sensing line SENL. A gate electrode of the third transistor M3 may be electrically connected to the sensing signal line SSL. The third transistor M3 may transmit a voltage (e.g., a voltage value) applied to the first connection electrode ELT1 to the sensing line SENL according to a sensing signal supplied to the sensing signal line SSL. The voltage (e.g., the voltage value) transmitted through the sensing line SENL may be provided to an external circuit (e.g., a timing controller), and the external circuit may extract characteristic information (e.g., the threshold voltage or the like of the first transistor M1) of each pixel PXL based on the provided voltage (e.g., the provided voltage value). The extracted characteristic information may be used to convert image data and a characteristic deviation between the pixels PXL may be compensated.

In FIG. 4, all transistors included in the pixel circuit PXC are n-type transistors, but are not limited thereto. For example, at least one of the first, second, and third transistors M1, M2, and M3 may be changed to a p-type transistor.

However, the disclosure is not limited to the embodiment shown in FIG. 4. A structure and a driving method of the pixel PXL may be variously changed. For example, the pixel circuit PXC may be configured of a pixel circuit having various structures and/or driving methods.

For example, the pixel circuit PXC may not include the third transistor M3. The pixel circuit PXC may further include other circuit elements such as a compensation transistor for compensating for the threshold voltage or the like of the first transistor M1, an initialization transistor for initializing the voltage of the first node N1 and/or the first electrode ELT1, an emission control transistor for controlling a period in which the driving current is supplied to the light emitting part EMU, a boosting capacitor for boosting the voltage of the first node N1, and/or the like.

The light emitting part EMU may include at least one light emitting element LD (or multiple light emitting elements LD) electrically connected between the first power VDD and second power VSS.

For example, the light emitting part EMU may include the first connection electrode ELT1 electrically connected to the first power VDD through the pixel circuit PXC and a first power line PL1, a fifth connection electrode ELT5 electrically connected to the second power VSS through a second power line PL2, and the light emitting elements LD electrically connected between the first and fifth connection electrodes ELT1 and ELT5.

The first power VDD and the second power VSS may have different potentials and the light emitting elements LD may emit light. For example, the first power VDD may be set as a high potential power, and the second power VSS may be set as a low potential power.

In an embodiment, the light emitting part EMU may include at least one series stage. Each series stage may include a pair of electrodes (e.g., two electrodes) and at least one light emitting element LD electrically connected in a forward direction between the pair of electrodes. The number of series stages configuring the light emitting part EMU and the number of light emitting elements LD configuring each series stage are not limited thereto. For example, the number of light emitting elements LD configuring each series stage may be identical to or different from each other, and the number of the light emitting elements LD is not limited thereto.

For example, the light emitting part EMU may include a first series stage including at least one first light emitting element LD1, a second series stage including at least one second light emitting element LD2, a third series stage including at least one third light emitting element LD3, and a fourth series stage including at least one fourth light emitting element LD4.

The first series stage may include the first connection electrode ELT1, a second connection electrode ELT2, and at least one first light emitting element LD1 electrically connected between the first and second connection electrodes ELT1 and ELT2. Each first light emitting element LD1 may be electrically connected in the forward direction between the first and second connection electrodes ELT1 and ELT2. For example, the first end EP1 of the first light emitting element LD1 may be electrically connected to the first connection electrode ELT1, and the second end EP2 of the first light emitting element LD1 may be electrically connected to the second connection electrode ELT2.

The second series stage may include the second connection electrode ELT2, a third connection electrode ELT3, and at least one second light emitting element LD2 electrically connected between the second and third connection electrodes ELT2 and ELT3. Each second light emitting element LD2 may be electrically connected in the forward direction between the second and third connection electrodes ELT2 and ELT3. For example, the first end EP1 of the second light emitting element LD2 may be electrically connected to the second connection electrode ELT2, and the second end EP2 of the second light emitting element LD2 may be electrically connected to the third connection electrode ELT3.

The third series stage may include the third connection electrode ELT3, a fourth connection electrode ELT4, and at least one third light emitting element LD3 electrically connected between the third and fourth connection electrodes ELT3 and ELT4. Each third light emitting element LD3 may be electrically connected in the forward direction between the third and fourth connection electrodes ELT3 and ELT4. For example, the first end EP1 of the third light emitting element LD3 may be electrically connected to the third connection electrode ELT3, and the second end EP2 of the third light emitting element LD3 may be electrically connected to the fourth connection electrode ELT4.

The fourth series stage may include the fourth connection electrode ELT4, the fifth connection electrode ELT5, and at least one fourth light emitting element LD4 electrically connected between the fourth and fifth connection electrodes ELT4 and ELT5. Each fourth light emitting element LD4 may be electrically connected in the forward direction between the fourth and fifth connection electrodes ELT4 and ELT5. For example, the first end EP1 of the fourth light emitting element LD4 may be electrically connected to the fourth connection electrode ELT4, and the second end EP2 of the fourth light emitting element LD4 may be electrically connected to the fifth connection electrode ELT5.

A first electrode (e.g., the first connection electrode ELT1) of the light emitting part EMU may be an anode electrode of the light emitting part EMU. A last electrode (e.g., the fifth connection electrode ELT5) of the light emitting part EMU may be a cathode electrode of the light emitting part EMU.

A remaining electrode (e.g., the second, third, and/or fourth connection electrodes ELT2, ELT3, and/or ELT4) of the light emitting part EMU may configure each intermediate electrode. For example, the second connection electrode ELT2 may configure a first intermediate electrode IET1, the third connection electrode ELT3 may configure a second intermediate electrode IET2, and the fourth connection electrode ELT4 may configure a third intermediate electrode IET3.

In case that the light emitting elements LD are electrically connected in a series/parallel structure, power efficiency may be improved compared to a pixel including light emitting elements LD electrically connected only in parallel. In the pixel PXL in which the light emitting elements LD are electrically connected in the series/parallel structure, a luminance may be expressed through the light emitting elements LD of a remaining series stage even though a short defect or the like occurs at a partial series stage. Thus, a possibility of a dark spot defect of the pixel PXL may be reduced. However, the disclosure is not limited thereto. For example, the light emitting unit EMU may include the light emitting elements LD electrically connected only in series. In other embodiments, the light emitting part EMU may include the light emitting elements LD electrically connected only in parallel.

Each of the light emitting elements LD may include the first end EP1 and the second end EP2. The first end EP1 (e.g., a p-type end) may be electrically connected to the first power VDD via at least one electrode (e.g., the first connection electrode ELT1), the pixel circuit PXC, the first power line PL1, and/or the like. The second end EP2 (e.g., an n-type end) may be electrically connected to the second power VSS via at least another electrode (e.g., the fifth connection electrode ELT5), the second power line PL2, and/or the like. For example, the light emitting elements LD may be electrically connected in the forward direction between the first power VDD and the second power VSS. The light emitting elements LD may be electrically connected in the forward direction, and effective light sources of the light emitting part EMU may be configured by the light emitting elements LD.

In case that the driving current is supplied through the corresponding pixel circuit PXC, the light emitting elements LD may emit light with a luminance corresponding to the driving current. For example, during each frame period, the pixel circuit PXC may supply the driving current corresponding to a grayscale value (e.g., a grayscale value to be expressed in the corresponding frame) to the light emitting part EMU. Accordingly, the light emitting elements LD may emit light with the luminance corresponding to the driving current, and the light emitting part EMU may express the luminance corresponding to the driving current.

Figure 5:
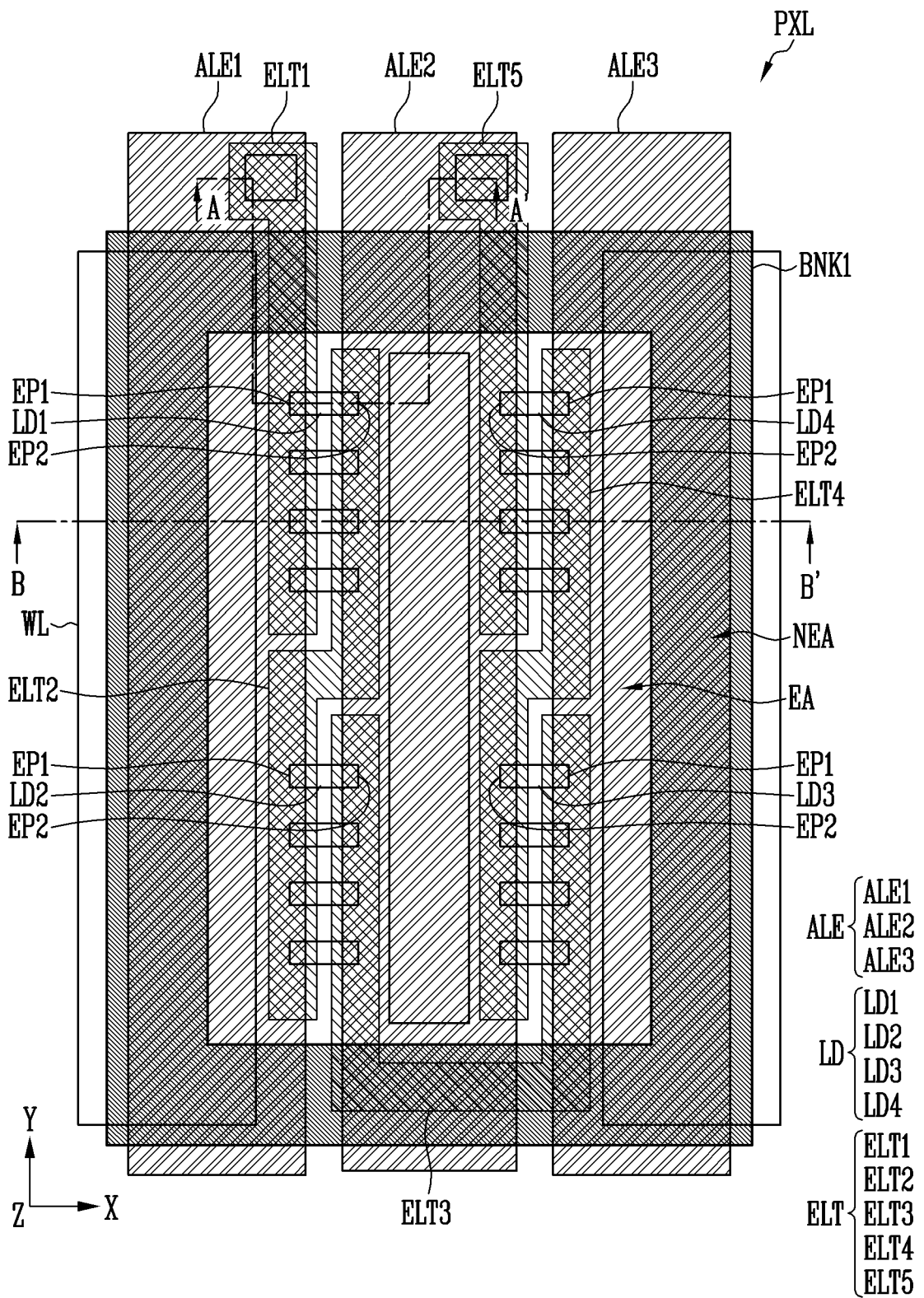
FIG. 5 is a schematic plan view illustrating a pixel according to an embodiment.
Figure 6:
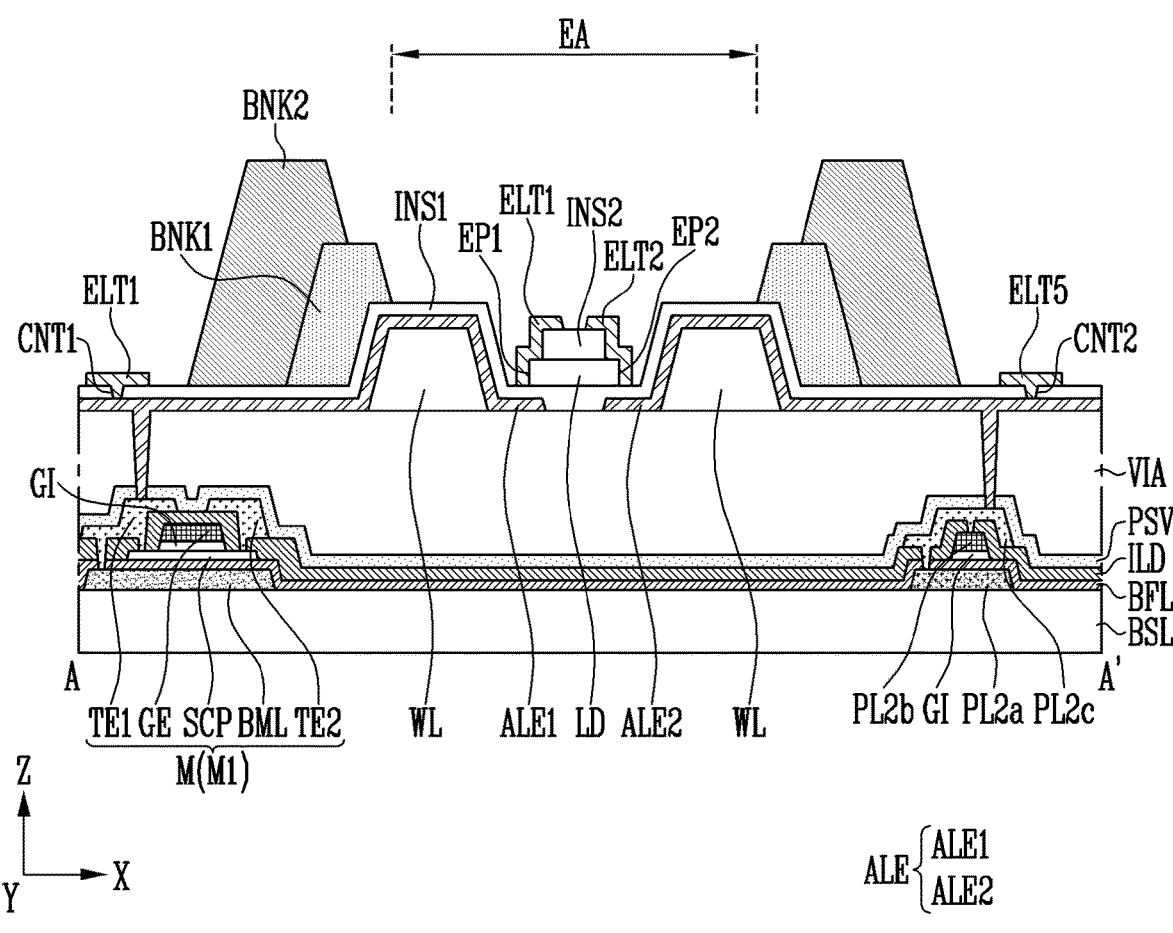
FIG. 6 is a schematic cross-sectional view taken along line A-A' of FIG. 5.
Figure 7:
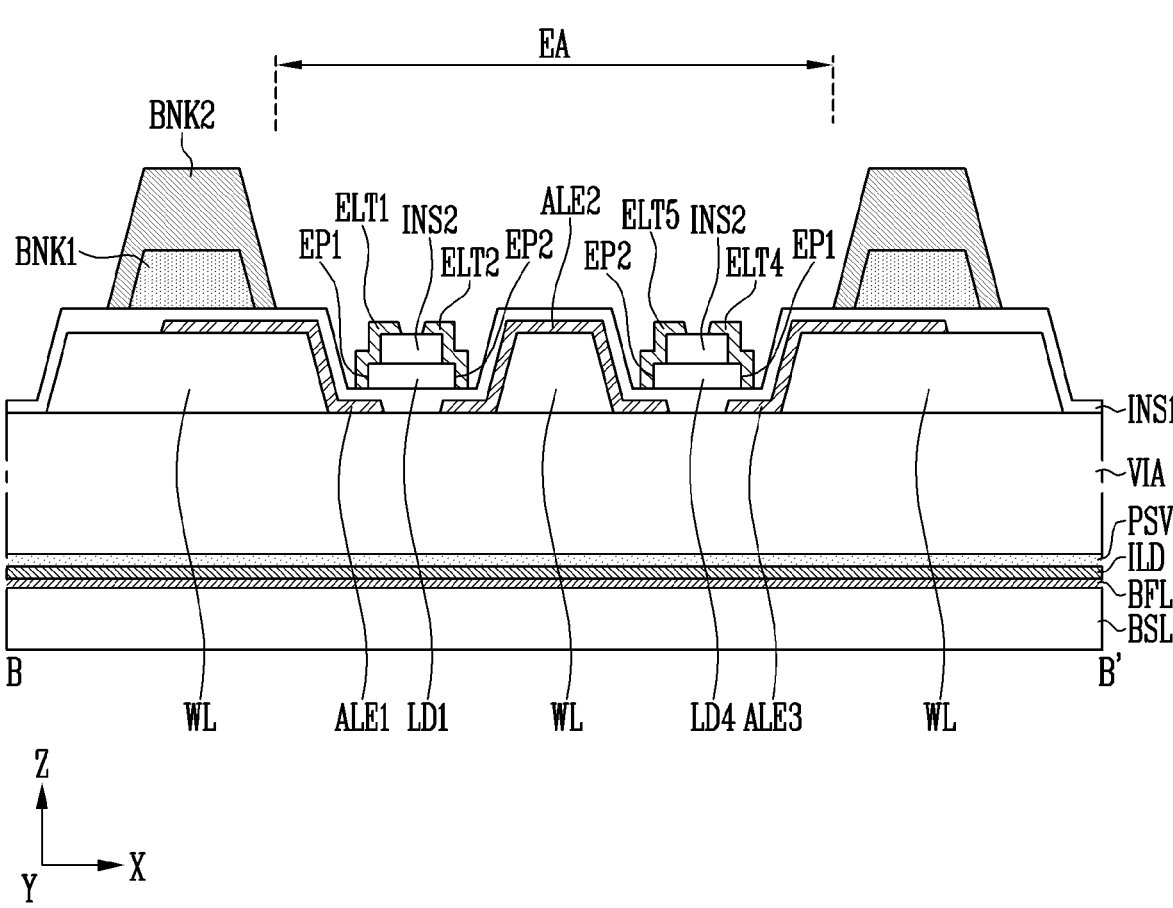
FIG. 7 is a schematic cross-sectional view taken along line B-B' of FIG. 5.
Figure 8:
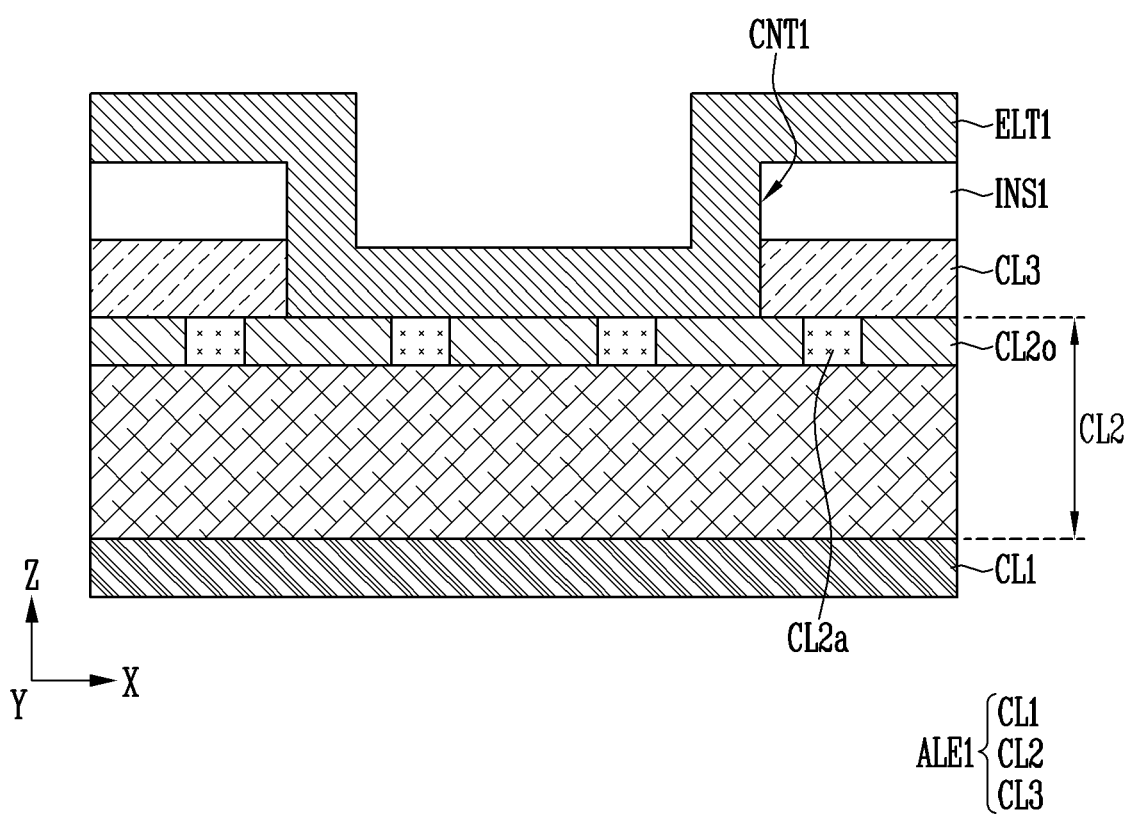
FIG. 8 is a schematic cross-sectional view illustrating a contact hole according to an embodiment.

FIG. 5 is a schematic plan view illustrating a pixel according to an embodiment. FIG. 6 is a schematic cross-sectional view taken along line A-A' of FIG. 5. FIG. 7 is a schematic cross-sectional view taken along line B-B' of FIG. 5. FIG. 8 is a schematic cross-sectional view illustrating a contact hole according to an embodiment. For example, FIG. 5 may be any one of the first to third pixels PXL1, PXL2, and PXL3 configuring the pixel part PXU of FIG. 3, and the first to third pixels PXL1, PXL2, and PXL3 may have structures identical or similar to each other. In FIG. 5, each pixel PXL includes light emitting elements LD disposed in four series stages as shown in FIG. 4, but the number of series stages of each pixel PXL may be variously changed according to an embodiment.

Hereinafter, in case that one or more of the first to fourth light emitting elements LD1, LD2, LD3, and LD4 are arbitrarily referred to, or in case that two or more types of light emitting elements are collectively referred to, the one or more of the first to fourth light emitting elements LD1, LD2, LD3, and LD4 or the two or more types of light emitting elements are referred to as a "light emitting element LD" or "light emitting elements LD". When at least one of electrodes including first to third electrodes ALE1, ALE2, and ALE3 is arbitrarily referred to, the at least one of electrodes is referred to as an "electrode ALE" or "electrodes ALE", and when at least one of electrodes including the first to fifth connection electrodes ELT1, ELT2, ELT3, ELT4, and ELT5 is arbitrarily referred to, the at least one of connection electrodes is referred to as a "connection electrode ELT" or "connection electrodes ELT".

Referring to FIG. 5, each pixel PXL may include an emission area EA and a non-emission area NEA. The emission area EA may be an area where the light emitting elements LD may be included and light may be emitted. The non-emission area NEA may be adjacent to (e.g., surround) the emission area EA. The non-emission area NEA may be an area in which a first bank BNK1 surrounding the emission area EA is provided. The first bank BNK1 may be provided in the non-emission area NEA and may at least partially surround the emission area EA.

The first bank BNK1 may include an opening overlapping the emission area EA. The opening of the first bank BNK1 may provide a space in which the light emitting elements LD may be provided. Detailed description of the opening of the first bank BNK1 is provided below. For example, a type (e.g., a desired or selectable type) and/or an amount (e.g., a desired or selectable amount) of light emitting elements LD may be supplied to the space partitioned by the opening of the first bank BNK1.

Each of the pixels PXL may include partition walls WL, electrodes ALE, the light emitting elements LD, and/or connection electrodes ELT.

The partition walls WL may be provided at least in the emission area EA. The partition walls WL may be disposed at least partially in the non-emission area NEA. The partition walls WL may extend in a second direction (e.g., in a Y-axis direction) and may be spaced apart from each other in a first direction (e.g., in an X-axis direction).

Each of the partition walls WL may partially overlap at least one electrode ALE at least in the emission area EA. For example, the partition walls WL may be provided under the electrodes ALE, respectively. In case that the partition walls WL are provided under an area of the respective electrodes ALE, an area of each of the electrodes ALE may protrude in an upper direction (e.g., a third direction or in a Z-axis direction) of the pixel PXL in an area where the partition walls WL are formed. In case that the partition walls WL and/or the electrodes ALE include a reflective material, a reflective wall structure may be formed around the light emitting elements LD. Accordingly, light emitted from the light emitting elements LD may be emitted in the upper direction of the pixel PXL (e.g., a front surface direction of the display panel PNL including a viewing angle range), and light emission efficiency of the display panel PNL may be improved.

The electrodes ALE may be provided at least in the emission area EA. The electrodes ALE may extend in the second direction (e.g., in the Y-axis direction) and may be spaced apart from each other in the first direction (e.g., in the X-axis direction).

Each of the first to third electrodes ALE1, ALE2, and ALE3 may extend in the second direction (e.g., in the Y-axis direction), and may be sequentially spaced apart from one another in the first direction (e.g., in the X-axis direction). Some of the electrodes ALE may be electrically connected to the pixel circuit PXC of FIG. 4 and/or a power line through a contact hole. For example, a first electrode ALE1 may be electrically connected to the pixel circuit PXC and/or the first power line PL1 through the contact hole, and a second electrode ALE2 may be electrically connected to the second power line PL2 through the contact hole.

According to an embodiment, some of the electrodes ALE may be electrically connected to some of the connection electrodes ELT through a contact hole. For example, the first electrode ALE1 may be electrically connected to the first connection electrode ELT1 through a contact hole, and the second electrode ALE2 may be electrically connected to the fifth connection electrode ELT5 through a contact hole.

A pair of electrodes ALE adjacent to each other may receive different signals in an alignment step of the light emitting elements LD. For example, in case that the first to third electrodes ALE1, ALE2, and ALE3 are sequentially arranged in the first direction (e.g., in the X-axis direction). The first electrode ALE1 and the second electrode ALE2 may receive different alignment signals, and the second electrode ALE2 and the third electrode ALE3 may receive different alignment signals.

Each of the light emitting elements LD may be aligned between a pair of electrodes ALE in the emission area EA. Each of the light emitting elements LD may be electrically connected between a pair of connection electrodes ELT.

The first light emitting element LD1 may be aligned between the first and second electrodes ALE1 and ALE2. The first light emitting element LD1 may be electrically connected between the first and second connection electrodes ELT1 and ELT2. For example, the first light emitting element LD1 may be aligned in a first area (e.g., in an upper area) of the first and second electrodes ALE1 and ALE2. The first end EP1 of the first light emitting element LD1 may be electrically connected to the first connection electrode ELT1, and the second end EP2 of the first light emitting element LD1 may be electrically connected to the second connection electrode ELT2.

The second light emitting element LD2 may be aligned between the first and second electrodes ALE1 and ALE2. The second light emitting element LD2 may be electrically connected between the second and third connection electrodes ELT2 and ELT3. For example, the second light emitting element LD2 may be aligned in a second area (e.g., in a lower area) of the first and second electrodes ALE1 and ALE2. The first end EP1 of the second light emitting element LD2 may be electrically connected to the second connection electrode ELT2, and the second end EP2 of the second light emitting element LD2 may be electrically connected to the third connection electrode ELT3.

The third light emitting element LD3 may be aligned between the second and third electrodes ALE2 and ALE3. The third light emitting element LD3 may be electrically connected between the third and fourth connection electrodes ELT3 and ELT4. For example, the third light emitting element LD3 may be aligned in a second area (e.g., in a lower area) of the second and third electrodes ALE2 and ALE3. The first end EP1 of the third light emitting element LD3 may be electrically connected to the third connection electrode ELT3, and the second end EP2 of the third light emitting element LD3 may be electrically connected to the fourth connection electrode ELT4.

The fourth light emitting element LD4 may be aligned between the second and third electrodes ALE2 and ALE3. The fourth light emitting element LD4 may be electrically connected between the fourth and fifth connection electrodes ELT4 and ELT5. For example, the fourth light emitting element LD4 may be aligned in a first area (e.g., in an upper area) of the second and third electrodes ALE2 and ALE3. The first end EP1 of the fourth light emitting element LD4 may be electrically connected to the fourth connection electrode ELT4, and the second end EP2 of the fourth light emitting element LD4 may be electrically connected to the fifth connection electrode ELT5.

For example, the first light emitting element LD1 may be positioned in an upper left area of the emission area EA, and the second light emitting element LD2 may be positioned in a lower left area of the emission area EA. The third light emitting element LD3 may be positioned in a lower right area of the emission area EA, and the fourth light emitting element LD4 may be positioned in an upper right area of the emission area EA. However, an arrangement, a connection structure, and/or the like of the light emitting elements LD may be variously changed according to a structure of the light emitting part EMU, the number of series stages, and the like.

Each of the connection electrodes ELT may be provided at least in the emission area EA and may overlap at least one electrode ALE and/or the light emitting element LD. For example, each of the connection electrodes ELT may be formed on the electrodes ALE and/or the light emitting elements LD and overlap the electrodes ALE and/or the light emitting elements LD. The connection electrode ELT may be electrically connected to the light emitting elements LD.

The first connection electrode ELT1 may be disposed in a first area (e.g., in an upper area) of the first electrode ALE1 and on the first ends EP1 of the first light emitting elements LD1, and may be electrically connected to the first ends EP1 of the first light emitting elements LD1.

The second connection electrode ELT2 may be disposed in a first area (e.g., in an upper area) of the second electrode ALE2 and on the second ends EP2 of the first light emitting elements LD1, and may be electrically connected to the second ends EP2 of the first light emitting elements LD1. The second connection electrode ELT2 may be disposed in a second area (e.g., in a lower area) of the first electrode ALE1 and on the first ends EP1 of the second light emitting elements LD2, and may be electrically connected to the first ends EP1 of the second light emitting elements LD2. For example, the second connection electrode ELT2 may have a curved shape. For example, the second connection electrode ELT2 may have a bent or curved structure at a boundary between an area where the at least one first light emitting element LD1 is arranged and an area where the at least one second light emitting element LD2 is arranged.

The third connection electrode ELT3 may be disposed in a second area (e.g., in a lower area) of the second electrode ALE2 and on the second ends EP2 of the second light emitting elements LD2, and may be electrically connected to the second ends EP2 of the second light emitting elements LD2. The third connection electrode ELT3 may be disposed in a second area (e.g., in a lower area) of the third electrode ALE3 and on the first ends EP1 of the third light emitting elements LD3, and may be electrically connected to the first ends EP1 of the third light emitting elements LD3. For example, the third connection electrode ELT3 may electrically connect the second ends EP2 of the second light emitting elements LD2 and the first ends EP1 of the third light emitting elements LD3 in the emission area EA. For example, the third connection electrode ELT3 may have a curved shape. For example, the third connection electrode ELT3 may have a bent or curved structure at a boundary between an area where the at least one second light emitting element LD2 is arranged and an area where the at least one third light emitting element LD3 is arranged.

The fourth connection electrode ELT4 may be disposed in a second area (e.g., in a lower area) of the second electrode ALE2 and on the second ends EP2 of the third light emitting elements LD3, and may be electrically connected to the second ends EP2 of the third light emitting elements LD3. The fourth connection electrode ELT4 may be disposed in a first area (e.g., in an upper area) of the third electrode ALE3 and on the first ends EP1 of the fourth light emitting elements LD4, and may be electrically connected to the first ends EP1 of the fourth light emitting elements LD4. For example, the fourth connection electrode ELT4 may electrically connect the second ends EP2 of the third light emitting elements LD3 and the first ends EP1 of the fourth light emitting elements LD4 in the emission area EA. For example, the fourth connection electrode ELT4 may have a curved shape. For example, the fourth connection electrode ELT4 may have a bent or curved structure at a boundary between an area where at least one third light emitting element LD3 is arranged and an area where at least one fourth light emitting element LD4 is arranged.

The fifth connection electrode ELT5 may be disposed in a first area (e.g., in an upper area) of the second electrode ALE2 and on the second ends EP2 of the fourth light emitting elements LD4, and may be electrically connected to the second ends EP2 of the fourth light emitting elements LD4.

The first to fifth connection electrodes ELT1, ELT2, ELT3, ELT4, and ELT5 may be formed of a same conductive layer. As described above, in case that the first to fifth connection electrodes ELT1, ELT2, ELT3, ELT4, and ELT5 are formed of the same conductive layer, the number of masks may be reduced and a manufacturing process may be simplified.

In a method described above, the light emitting elements LD aligned between the electrodes ALE (e.g., the first and second electrodes ALE1 and ALE2) may be electrically connected in a form (e.g., a desired or selectable form) using the connection electrodes ELT. For example, the first light emitting elements LD1, the second light emitting elements LD2, the third light emitting elements LD3, and the fourth light emitting elements LD4 may be sequentially and electrically connected in series using the connection electrodes ELT.

Hereinafter, a cross-sectional structure of the pixel PXL is described in detail with reference to FIGS. 6 to 8. FIG. 6 shows the first transistor M1 among various circuit elements configuring the pixel circuit PXC of FIG. 4. When the first to third transistors M1, M2, and M3 are not required to be separately specified, the first to third transistors M1, M2, and M3 are collectively referred to as "transistor M". A structure, a position for each layer, and/or the like of the transistors M are/is not limited to the embodiment shown in FIG. 6 and may be variously changed according to an embodiment. FIG. 8 shows the pixel PXL based on a first contact hole CNT1, and the first contact hole CNT1 and a second contact hole CNT2 may have the same or similar cross-sectional structure.

The pixels PXL according to an embodiment may include a circuit element including the transistors M disposed on a base layer BSL, and various lines electrically connected to the circuit elements. The electrodes ALE, the light emitting elements LD, the connection electrodes ELT, the first bank BNK1, and/or a second bank BNK2 may be disposed on the circuit elements.

The base layer BSL may configure a base member, and may be a rigid or flexible substrate or film. For example, the base layer BSL may be a rigid substrate formed of glass or tempered glass, a flexible substrate (or thin film) of a plastic or metal material, or at least one insulating layer. A material and/or a physical property of the base layer BSL are/is not limited thereto. In an embodiment, the base layer BSL may be substantially transparent. Here, "substantially transparent" may mean that light may be transmitted at a transmittance or more. In another embodiment, the base layer BSL may be translucent or opaque. The base layer BSL may include a reflective material according to an embodiment.

The lower conductive layer BML and a first power conductive layer PL2a may be disposed on the base layer BSL. The lower conductive layer BML and the first power conductive layer PL2a may be disposed on a same layer. For example, the lower conductive layer BML and the first power conductive layer PL2a may be simultaneously formed in a same process, but are not limited thereto. The first power conductive layer PL2a may configure the second power line PL2 described with reference to FIG. 4 or the like.

For example, each of the lower conductive layer BML and the first power conductive layer PL2a may be formed as a single layer or multiple layers including at least one of molybdenum (Mo), copper (Cu), aluminum (Al), chromium (Cr), gold (Au), titanium (Ti), nickel (Ni), neodymium (Nd), indium (In), and tin (Sn). For example, each of the lower conductive layer BML and the first power conductive layer PL2a may include an oxide thereof and/or an alloy thereof.

A buffer layer BFL may be disposed on the lower conductive layer BML and the first power conductive layer PL2a. The buffer layer BFL may prevent an impurity from being diffused into the circuit element. The buffer layer BFL may be configured as a single layer. In other embodiments, the buffer layer BFL may be configured as multiple layers of at least two or more layers. In case that the buffer layer BFL is formed of multiple layers, each layer may be formed of a same material or may be formed of different materials.

A semiconductor pattern SCP may be disposed on the buffer layer BFL. For example, each semiconductor pattern SCP may include a first area that is in contact with a first transistor electrode TE1, a second area that is in contact with a second transistor electrode TE2, and a channel area positioned between the first and second areas. According to an embodiment, one of the first and second areas may be a source area and another thereof may be a drain area.

According to an embodiment, the semiconductor pattern SCP may be formed of polysilicon, amorphous silicon, oxide semiconductor, or the like. The channel area of the semiconductor pattern SCP may include an intrinsic semiconductor as a semiconductor pattern that is not doped with an impurity, and each of the first and second areas of the semiconductor pattern SCP may include a semiconductor doped with an impurity.

A gate insulating layer GI may be disposed on the buffer layer BFL and the semiconductor pattern SCP. For example, the gate insulating layer GI may be disposed between the semiconductor pattern SCP and a gate electrode GE. The gate insulating layer GI may be disposed between the buffer layer BFL and a second power conductive layer PL2b. For example, the gate insulating layer GI may be configured as a single layer or multiple layers, and may include various types of inorganic materials including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE of the transistor M and the second power conductive layer PL2b may be disposed on the gate insulating layer GI. The gate electrode GE and the second power conductive layer PL2b may be disposed on a same layer. For example, the gate electrode GE and the second power conductive layer PL2b may be simultaneously formed in a same process, but are not limited thereto. The gate electrode GE may overlap the semiconductor pattern SCP in the third direction (e.g., in the Z-axis direction) on the gate insulating layer GI. The second power conductive layer PL2b may overlap the first power conductive layer PL2a in the third direction (e.g., in the Z-axis direction) on the gate insulating layer GI. The first power conductive layer PL2a and the second power conductive layer PL2b may configure the second power line PL2 described with reference to FIG. 4.

For example, each of the gate electrode GE and the second power conductive layer PL2b may be formed as a single layer or multiple layers including at least one of molybdenum (Mo), copper (Cu), aluminum (Al), chromium (Cr), gold (Au), titanium (Ti), nickel (Ni), neodymium (Nd), indium (In), and tin (Sn). For example, each of the gate electrode GE and the second power conductive layer PL2b may include an oxide thereof and/or an alloy thereof. For example, each of the gate electrode GE and the second power conductive layer PL2b may be formed as multiple layers in which titanium (Ti), copper (Cu), and/or indium tin oxide (ITO) are/is sequentially or repeatedly stacked one another.

An interlayer insulating layer ILD may be disposed on the gate electrode GE and the second power conductive layer PL2b. For example, the interlayer insulating layer ILD may be disposed between the gate electrode GE and the first and second transistor electrodes TE1 and TE2. The interlayer insulating layer ILD may be disposed between the second power conductive layer PL2b and a third power conductive layer PL2c.

For example, the interlayer insulating layer ILD may be configured as a single layer or multiple layers, and may include various types of inorganic materials including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second transistor electrodes TE1 and TE2 of the transistor M and the third power conductive layer PL2c may be disposed on the interlayer insulating layer ILD. The first and second transistor electrodes TE1 and TE2 and the third power conductive layer PL2c may be disposed on a same layer. For example, the first and second transistor electrodes TE1 and TE2 and the third power conductive layer PL2c may be simultaneously formed in a same process, but are not limited thereto.

The first and second transistor electrodes TE1 and TE2 may overlap the semiconductor pattern SCP in the third direction (e.g., in the Z-axis direction). The first and second transistor electrodes TE1 and TE2 may be electrically connected to the semiconductor pattern SCP. For example, the first transistor electrode TE1 may be electrically connected to the first area of the semiconductor pattern SCP through a contact hole passing through the interlayer insulating layer ILD. The first transistor electrode TE1 may be electrically connected to the lower conductive layer BML through a contact hole passing through the interlayer insulating layer ILD and the buffer layer BFL. The second transistor electrode TE2 may be electrically connected to the second area of the semiconductor pattern SCP through a contact hole passing through the interlayer insulating layer ILD. According to an embodiment, any one of the first and second transistor electrodes TE1 and TE2 may be a source electrode, and another thereof may be a drain electrode.

The third power conductive layer PL2c may overlap the first power conductive layer PL2a and/or the second power conductive layer PL2b in the third direction (e.g., in the Z-axis direction). The third power conductive layer PL2c may be electrically connected to the first power conductive layer PL2a and/or the second power conductive layer PL2b. For example, the third power conductive layer PL2c may be electrically connected to the first power conductive layer PL2a through a contact hole passing through the interlayer insulating layer ILD and the buffer layer BFL. The third power conductive layer PL2c may be electrically connected to the second power conductive layer PL2b through a contact hole passing through the interlayer insulating layer ILD. The third power conductive layer PL2c, the first power conductive layer PL2a, and/or the second power conductive layer PL2b may configure the second power line PL2 described with reference to FIG. 5.

For example, the first and second transistor electrodes TE1 and TE2 and the third power conductive layer PL2c may be formed as a single layer or multiple layers including at least one of molybdenum (Mo), copper (Cu), aluminum (Al), chromium (Cr), gold (Au), titanium (Ti), nickel (Ni), neodymium (Nd), indium (In), and tin (Sn). For example, the first and second transistor electrodes TE1 and TE2 and the third power conductive layer PL2c may include an oxide thereof and/or an alloy thereof.

A protective layer PSV may be disposed on the first and second transistor electrodes TE1 and TE2 and the third power conductive layer PL2c. For example, the protective layer PSV may be configured as a single layer or multiple layers, and may include various types of inorganic materials including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A via layer VIA may be disposed on the protective layer PSV. The via layer VIA may be formed of an organic material and planarize a lower step difference. For example, the via layer VIA may include at least one organic material of an acrylates resin, an epoxy resin, a phenolic resin, a polyamides resin, a polyimides resin, a polyesters resin, a polyphenylenesulfides resin, and benzocyclobutene (BCB). However, the disclosure is not limited thereto. For example, the via layer VIA may include various types of inorganic materials including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The partition walls WL may be disposed on the via layer VIA. The partition walls WL may form a step difference and the light emitting elements LD may be readily aligned in the emission area EA.

The partition walls WL may have various shapes according to an embodiment. In an embodiment, the partition walls WL may have a shape protruding in the third direction (e.g., in the Z-axis direction) on the base layer BSL. The partition walls WL may have an inclined surface inclined at an angle with respect to the base layer BSL. However, the disclosure is not limited thereto, and the partition walls WL may have a side wall of a curved surface, a step shape, or the like. For example, the partition walls WL may have a semi-circular cross-section, a semi-elliptical cross-section, or the like.

The partition walls WL may include at least one organic material and/or inorganic material. For example, the partition walls WL may include at least one organic material of an acrylates resin, an epoxy resin, a phenolic resin, a polyamides resin, a polyimides resin, a polyesters resin, a polyphenylenesulfides resin, and benzocyclobutene (BCB). However, the disclosure is not limited thereto. For example, the partition walls WL may include various types of inorganic materials including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The electrodes ALE (e.g., the first and second electrodes ALE1 and ALE2) may be disposed on the via layer VIA and the partition walls WL. The electrodes ALE may at least partially cover a side surface and/or an upper surface of the partition walls WL. The electrodes ALE disposed on the partition walls WL may have a shape corresponding to the partition wall WL. For example, the electrodes ALE disposed on the partition walls WL may include an inclined surface or a curved surface having a shape corresponding to a shape of the partition walls WL. The partition walls WL and the electrodes ALE may reflect the light emitted from the light emitting elements LD and guide the light in a front direction (e.g., in the third direction or in the Z-axis direction) of the pixel PXL as a reflective member, and the light output efficiency of the display panel PNL may be improved.

The electrodes ALE may be spaced apart from each other. The electrodes ALE may be disposed on a same layer. For example, the electrodes ALE may be simultaneously formed in a same process, but are not limited thereto.

The electrodes ALE may receive an alignment signal in an alignment step of the light emitting elements LD. Accordingly, an electric field may be formed between the electrodes ALE (e.g., the first and second electrodes ALE1 and ALE2), and the light emitting elements LD provided to each of the pixels PXL may be aligned between the electrodes ALE.

Referring to FIG. 8, each of the electrodes ALE may include a first electrode layer CL1, a second electrode layer CL2, and a third electrode layer CL3 sequentially stacked one another.

The first electrode layer CL1 may block outgas generated from the via layer VIA positioned thereunder. For example, the first electrode layer CL1 may include IZO. For example, the first electrode layer CL1 may include about 10 atomic percent (hereinafter, referred to as "at %") to about 30 at % of Zn and about 70 at % to about 90 at % of In, but is not limited thereto. A thickness of the first electrode layer CL1 may be in a range of about 50 Å to about 150 Å, but is not limited thereto.

The second electrode layer CL2 may be disposed (e.g., directly disposed) on the first electrode layer CL1. The second electrode layer CL2 may be formed of an aluminum alloy. For example, the second electrode layer CL2 may include about 0.5 at % to about 1.0 at % of Ni, about 0.3 at % to about 1.0 at % of La, about 0.5 at % to about 1.0 at % of Cu, and a balance of Al. A surface of the second electrode layer CL2 may include an aluminum oxide layer CL2o and an Al—Ni—Cu precipitate CL2a. For example, the Al—Ni—Cu precipitate CL2a may form fine crystals and may be distributed in the aluminum oxide layer CL2o. As described above, in case that the surface of the second electrode layer CL2 includes the Al—Ni—Cu precipitate CL2a, galvanic corrosion may be prevented and a contact resistance with a connection electrode ELT may be minimized. Detailed description of the connection electrode ELT is provided below. A thickness of the second electrode layer CL2 may be in a range of about 1,000 Å to about 2,000 Å, but is not limited thereto.

The third electrode layer CL3 may be disposed (e.g., directly disposed) on the second electrode layer CL2. The third electrode layer CL3 may protect the second electrode layer CL2. For example, the second electrode layer CL2 may be covered by the third electrode layer CL3, and the third electrode layer CL3 may prevent the second electrode layer CL2 from being damage by an etchant in a process of etching the first insulating layer INS1, the first bank BNK1, and the like, which is a subsequent process. For example, the third electrode layer CL3 may include IZO having strong chemical resistance. After the first insulating layer INS1 and the first bank BNK1 is etched, a contact hole CNT (e.g., the first contact hole CNT1) may be formed in the third electrode layer CL3, and the second electrode layer CL2 may be exposed through the contact hole CNT. The connection electrode ELT may contact the surface of the second electrode layer CL2 through the contact hole CNT. A thickness of the third electrode layer CL3 may be in a range of about 50 Å to about 150 Å, but is not limited thereto. The first electrode layer CL1 and the third electrode layer CL3 may include a same material, but is not limited thereto.

Referring to FIGS. 5 to 8, the first electrode ALE1 may be electrically connected to the first transistor electrode TE1 of the transistor M through a contact hole passing through the via layer VIA and the protective layer PSV. The second electrode ALE2 may be electrically connected to the third power conductive layer PL2c through a contact hole passing through the via layer VIA and the protective layer PSV.

A first insulating layer INS1 may be disposed on the electrodes ALE. For example, the first insulating layer INS1 may be configured as a single layer or multiple layers, and may include various types of inorganic materials including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first bank BNK1 may be disposed on the first insulating layer INS1. The first bank BNK1 may include an opening overlapping the emission area EA. The opening of the first bank BNK1 may provide a space in which the light emitting elements LD may be provided in the step of supplying the light emitting elements LD to each of the pixels PXL. For example, a type (e.g., a desired or selectable type) and/or an amount (e.g., a desired or selectable amount) of a light emitting element ink may be supplied to the space partitioned by the opening of the first bank BNK1.

The first bank BNK1 may include at least one organic material of an acrylates resin, an epoxy resin, a phenolic resin, a polyamides resin, a polyimides resin, a polyesters resin, a polyphenylenesulfides resin, and benzocyclobutene (BCB). However, the disclosure is not limited thereto. For example, the first bank BNK1 may include various types of inorganic materials including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The light emitting elements LD may be disposed between the electrodes ALE (e.g., the first and second electrodes ALE1 and ALE2). The light emitting elements LD may be provided in the opening of the first bank BNK1 and disposed between the partition walls WL on the first insulating layer INS1.

The light emitting elements LD may be dispersed in a light emitting element ink and supplied to each of the pixels PXL through an inkjet printing method or the like. For example, the light emitting elements LD may be dispersed in a volatile solvent and provided to each of the pixels PXL. In case that an alignment signal is supplied to the electrodes ALE, an electric field may be formed between the electrodes ALE (e.g., the first and second electrodes ALE1 and ALE2), and the light emitting elements LD may be aligned between the electrodes ALE. After the light emitting elements LD are aligned, the solvent may be evaporated or removed in other methods. Thus, the light emitting elements LD may be stably arranged between the electrodes ALE.

A second insulating layer INS2 may be disposed on the light emitting elements LD. For example, the second insulating layer INS2 may be partially provided on the light emitting elements LD and may expose the first and second ends EP1 and EP2 of the light emitting elements LD. In case that the second insulating layer INS2 is formed on the light emitting elements LD after the light emitting elements LD are aligned, the light emitting elements LD may be prevented from being separated from an aligned position.

For example, the second insulating layer INS2 may be configured as a single layer or multiple layers, and may include various types of inorganic materials including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The connection electrodes ELT may be disposed on the first and second ends EP1 and EP2 of the light emitting elements LD exposed by the second insulating layer INS2. The first connection electrode ELT1 may be disposed (e.g., directly disposed) on the first end EP1 of the first light emitting elements LD1 and contact the first end EP1 of the first light emitting elements LD1.

The second connection electrode ELT2 may be disposed (e.g., directly disposed) on the second end EP2 of the first light emitting elements LD1 and contact the second end EP2 of the first light emitting elements LD1. The second connection electrode ELT2 may be disposed (e.g., directly disposed) on the first end EP1 of the second light emitting elements LD2 and contact the first end EP1 of the second light emitting elements LD2. For example, the second connection electrode ELT2 may electrically connect the second end EP2 of the first light emitting elements LD1 and the first end EP1 of the second light emitting elements LD2.

The third connection electrode ELT3 may be disposed (e.g., directly disposed) on the second end EP2 of the second light emitting elements LD2 and contact the second end EP2 of the second light emitting elements LD2. The third connection electrode ELT3 may be disposed (e.g., directly disposed) on the first end EP1 of the third light emitting elements LD3 and contact the first end EP1 of the third light emitting elements LD3. For example, the third connection electrode ELT3 may electrically connect the second end EP2 of the second light emitting elements LD2 and the first end EP1 of the third light emitting elements LD3.

The fourth connection electrode ELT4 may be disposed (e.g., directly disposed) on the second end EP2 of the third light emitting elements LD3 and contact the second end EP2 of the third light emitting elements LD3. The fourth connection electrode ELT4 may be disposed (e.g., directly disposed) on the first end EP1 of the fourth light emitting elements LD4 and contact the first end EP1 of the fourth light emitting elements LD4. For example, the fourth connection electrode ELT4 may electrically connect the second end EP2 of the third light emitting elements LD3 and the first end EP1 of the fourth light emitting elements LD4.

The fifth connection electrode ELT5 may be disposed (e.g., directly disposed) on the second end EP2 of the fourth light emitting elements LD4 and contact the second end EP2 of the fourth light emitting elements LD4.

The first connection electrode ELT1 may contact the surface of the second electrode layer CL2 (e.g., refer to FIG. 8) of the first electrode ALE1 through the first contact hole CNT1 passing through the first insulating layer INS1 and the third electrode layer CL3 of the first electrode ALE1. The fifth connection electrode ELT5 may contact the surface of the second electrode layer CL2 of the second electrode ALE2 through the second contact hole CNT2 passing through the first insulating layer INS1 and the third electrode layer CL3 of the second electrode ALE2. As described above, in case that the connection electrodes ELT contacts the surface of the second electrode layer CL2 including the Al—Ni—Cu precipitate CL2a, a contact resistance may be minimized. Thus, a heat generation may be decreased and a luminance of the display panel PNL may be improved.

The connection electrodes ELT may be formed of a same conductive layer. For example, the first to fifth connection electrodes ELT1, ELT2, ELT3, ELT4, and ELT5 may be disposed on a same layer. For example, the first to fifth connection electrodes ELT1, ELT2, ELT3, ELT4, and ELT5 may be simultaneously formed in a same process. As described above, in case that the connection electrodes ELT are simultaneously formed, the number of masks may be reduced and a manufacturing process may be simplified.

The connection electrodes ELT may be formed of various transparent conductive materials. For example, the connection electrodes ELT may include at least one transparent conductive material of indium tin oxide (ITO), indium zinc oxide (IZO), indium tin zinc oxide (ITZO), aluminum zinc oxide (AZO), gallium zinc oxide (GZO), zinc tin oxide (ZTO), and gallium tin oxide (GTO), and may be implemented to be substantially transparent or translucent to satisfy a light transmittance. Accordingly, light emitted from the first and second ends EP1 and EP2 of the light emitting elements LD may pass through the connection electrodes ELT and may be emitted to the outside of the display panel PNL.

The second bank BNK2 may be disposed on the first bank BNK1. The second bank BNK2 may include an opening overlapping the emission area EA. The opening of the second bank BNK2 may provide a space in which a color conversion layer. Detailed description of the color conversion layer is provided below. For example, a color conversion layer having a type (e.g., a desired or selectable type) and/or an amount (e.g., a desired or selectable amount) may be supplied to the space partitioned by the opening of the second bank BNK2.

Figure 9:
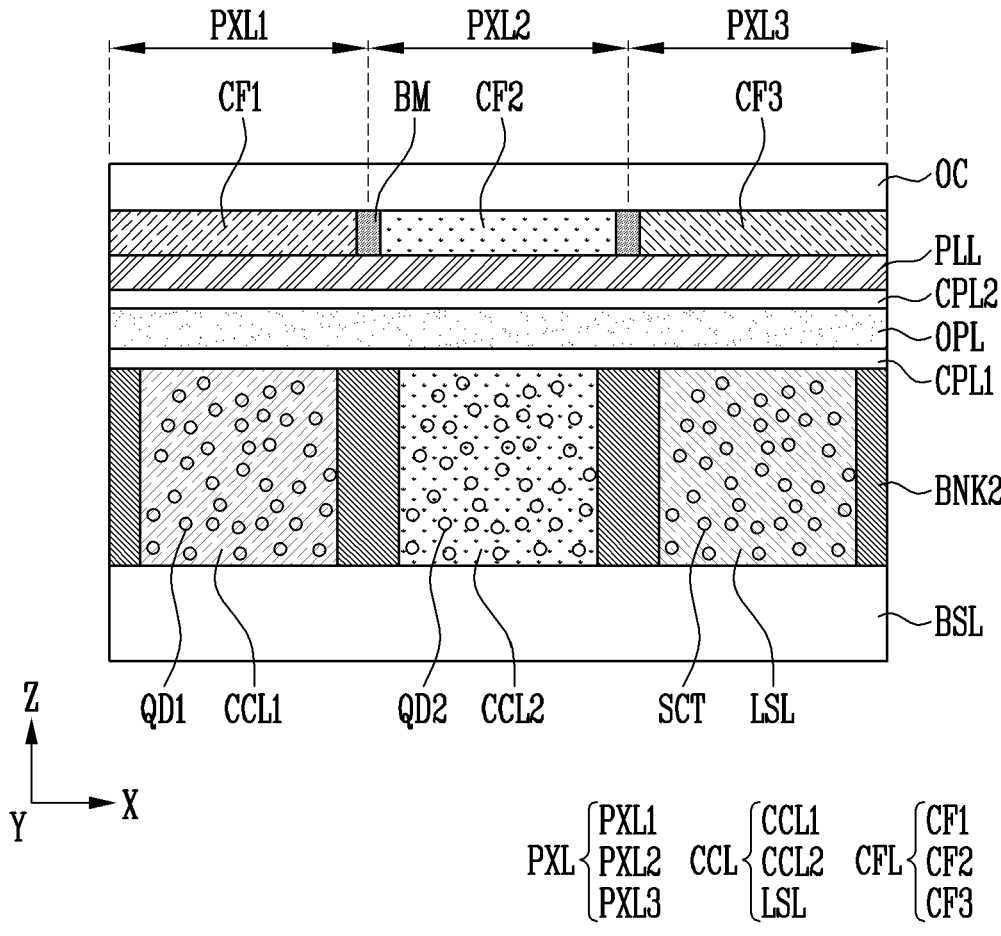
FIG. 9 is a schematic cross-sectional view illustrating first to third pixels according to an embodiment.
Figure 10:
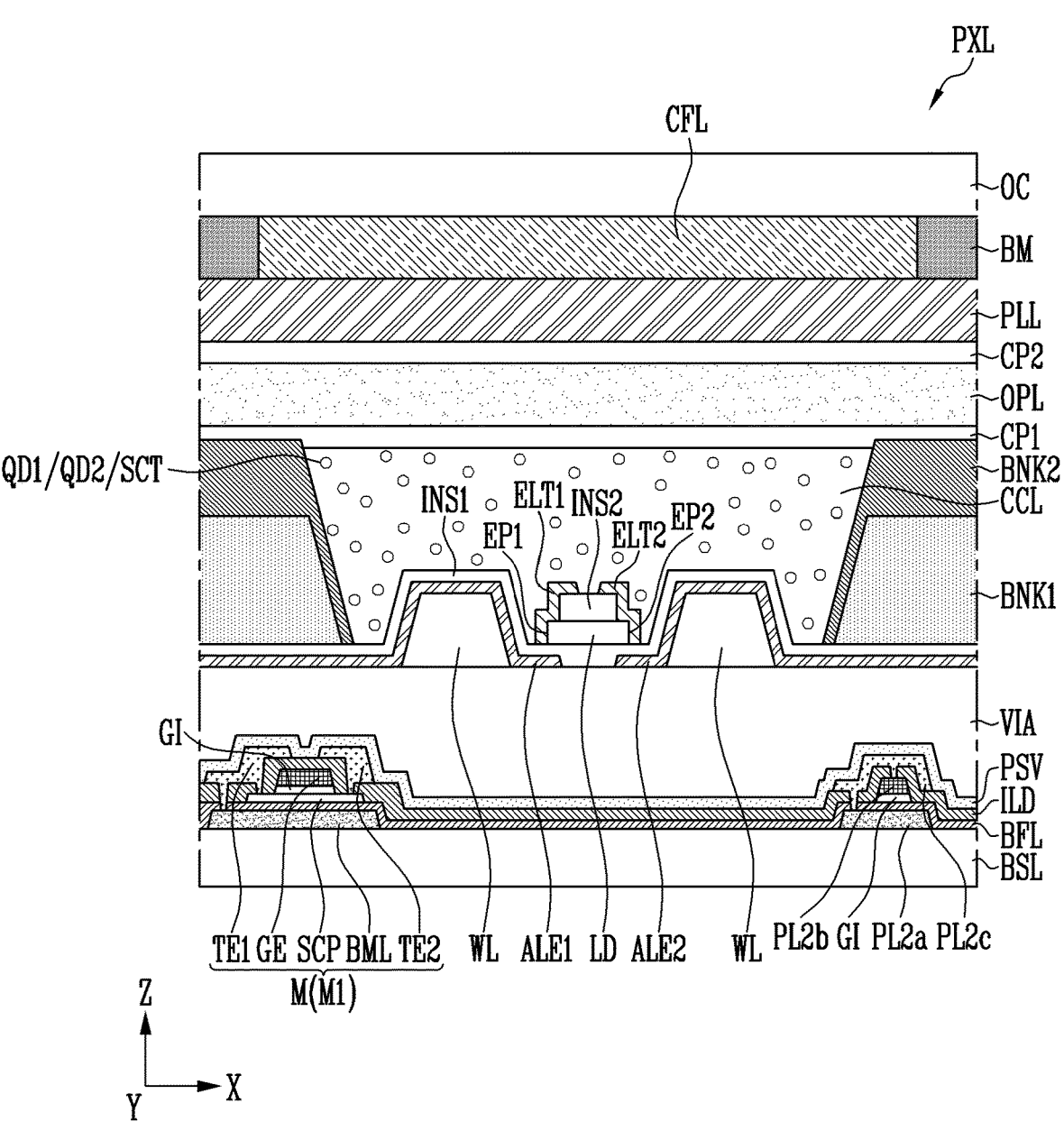
FIG. 10 is a schematic cross-sectional view of a pixel according to an embodiment.

FIG. 9 is a schematic cross-sectional view illustrating first to third pixels according to an embodiment. FIG. 10 is a cross-sectional view of a pixel according to an embodiment.

FIG. 9 shows a color conversion layer CCL, an optical layer OPL, a color filter layer CFL, a light blocking layer BM, and/or the like. In FIG. 9, a configuration except for the base layer BSL and the second bank BNK2 of FIGS. 6 and 7 is omitted for convenience of description. FIG. 10 schematically illustrates the pixel PXL in which the color conversion layer CCL, the optical layer OPL, and/or the color filter layer CFL are stacked.

Referring to FIGS. 9 and 10, the second bank BNK2 may be disposed between or at a boundary between the first to third pixels PXL1, PXL2, and PXL3, and may include an opening each overlapping the first to third pixels PXL1, PXL2, and PXL3. The opening of the second bank BNK2 may provide a space in which the color conversion layer CCL may be provided.

The second bank BNK2 may include at least one organic material of acrylates resin, epoxy resin, phenolic resin, polyamides resin, polyimides resin, polyesters resin, polyphenylenesulfides resin, polypropylene (PP), polytetrafluoroethylene (PTFE), and benzocyclobutene (BCB).

The color conversion layer CCL may be disposed on the light emitting elements LD in the opening of the second bank BNK2. The color conversion layer CCL may include a first color conversion layer CCL1 disposed in the first pixel PXL1, a second color conversion layer CCL2 disposed in the second pixel PXL2, and a scattering layer LSL disposed in the third pixel PXL3.

In an embodiment, the first to third pixels PXL1, PXL2, and PXL3 may include light emitting elements LD that emit light of a same color. For example, the first to third pixels PXL1, PXL2, and PXL3 may include light emitting elements LD emitting light of a third color (or blue). The color conversion layer CCL may include color conversion particles and may be disposed on each of the first to third pixels PXL1, PXL2, and PXL3. Thus, a full-color image may be displayed.

The first color conversion layer CCL1 may include first color conversion particles that convert light of the third color emitted from the light emitting element LD into light of the first color. For example, the first color conversion layer CCL1 may include first quantum dots QD1 dispersed in a matrix material such as a base resin.

In an embodiment, in case that the light emitting element LD is a blue light emitting element emitting blue light and the first pixel PXL1 is a red pixel, the first color conversion layer CCL1 may include first quantum dots QD1 that convert the blue light emitted from the blue light emitting element into red light. The first quantum dots QD1 may absorb the blue light and shift a wavelength according to an energy transition to emit the red light. In case that the first pixel PXL1 is a pixel of a different color, the first color conversion layer CCL1 may include first quantum dots QD1 corresponding to the color (e.g., the different color) of the first pixel PXL1.

The second color conversion layer CCL2 may include second color conversion particles that convert light of the third color emitted from the light emitting element LD into light of the second color. For example, the second color conversion layer CCL2 may include second quantum dots QD2 dispersed in a matrix material such as a base resin.

In an embodiment, in case that the light emitting element LD is the blue light emitting element emitting the blue light and the second pixel PXL2 is a green pixel, the second color conversion layer CCL2 may include second quantum dots QD2 that convert the blue light emitted from the blue light emitting element into green light. The second quantum dots QD2 may absorb the blue light and shift a wavelength according to an energy transition to emit the green light. In case that the second pixel PXL2 is a pixel of a different color, the second color conversion layer CCL2 may include second quantum dots QD2 corresponding to the color (e.g., the different color) of the second pixel PXL2.

In an embodiment, the blue light having a relatively short wavelength in a visible light area may be incident on the first quantum dots QD1 and the second quantum dots QD2, and absorption coefficients of the first quantum dots QD1 and the second quantum dots QD2 may be increased. Accordingly, efficiency of light emitted from the first pixel PXL1 and the second pixel PXL2 may be improved, and excellent color reproducibility may be secured. For example, the light emitting part EMU of the first to third pixels PXL1, PXL2, and PXL3 may include the light emitting elements LD of a same color (e.g., the blue light emitting element), and manufacturing efficiency of the display device may be increased.

The scattering layer LSL may be provided to efficiently use the light of the third color (or blue) emitted from the light emitting element LD. For example, in case that the light emitting element LD is the blue light emitting element emitting the blue light and the third pixel PXL3 is the blue pixel, the scattering layer LSL may include at least one type of scatterers SCT to efficiently use the light emitted from the light emitting element LD. For example, the scatterers SCT of the scattering layer LSL may include at least one of titanium oxide ($TiO_2$), barium sulfate ($BaSO_4$), calcium carbonate ($CaCO_3$), silicon oxide ($SiO_2$), silicon nitride ($Si_3N_4$), aluminum oxide ($Al_2O_3$), zirconium oxide ($ZrO_2$), and zinc oxide ($ZnO$). However, the disclosure is not limited thereto, and the scatterers SCT may be disposed in the third pixel PXL3 and another area. The scatterers SCT may be selectively included in the first color conversion layer CCL1 or the second color conversion layer CCL2. According to an embodiment, the scatterers SCT may be omitted and the scattering layer LSL may be formed of a transparent polymer.

A first capping layer CPL1 may be disposed on the color conversion layer CCL. The first capping layer CPL1 may be provided over the first to third pixels PXL1, PXL2, and PXL3. The first capping layer CPL1 may cover the color conversion layer CCL. The first capping layer CPL1 may prevent an impurity such as moisture or air from permeating from the outside and damaging (or contaminating) the color conversion layer CCL.

For example, the first capping layer CPL1 may be an inorganic layer, and may include at least one of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), and silicon oxynitride ($SiO_xN_y$). However, the disclosure is not limited thereto.

The optical layer OPL may be disposed on the first capping layer CPL1. The optical layer OPL may recycle light provided from the color conversion layer CCL by total reflection and improve light extraction efficiency. For example, the optical layer OPL may have a relatively low refractive index compared to the color conversion layer CCL. For example, the refractive index of the color conversion layer CCL may be in a range of about 1.6 to about 2.0, and the refractive index of the optical layer OPL may be in a range of about 1.1 to about 1.3.

A second capping layer CPL2 may be disposed on the optical layer OPL. The second capping layer CPL2 may be provided over the first to third pixels PXL1, PXL2, and PXL3. The second capping layer CPL2 may cover the optical layer OPL. The second capping layer CPL2 may prevent an impurity such as moisture or air from permeating from the outside and damaging or contaminating the optical layer OPL.

For example, the second capping layer CPL2 may be an inorganic layer, and may include at least one of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), and silicon oxynitride ($SiO_xN_y$). However, the disclosure is not limited thereto.

A planarization layer PLL may be disposed on the second capping layer CPL2. The planarization layer PLL may be provided over the first to third pixels PXL1, PXL2, and PXL3. The planarization layer PLL may include at least one organic material of an acrylates resin, an epoxy resin, a phenolic resin, a polyamides resin, a polyimides resin, a polyesters resin, a polyphenylenesulfides resin, and benzocyclobutene (BCB). However, the disclosure is not limited thereto. For example, the planarization layer PLL may include various types of inorganic materials including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be disposed on the planarization layer PLL. The color filter layer CFL may include color filters CF1, CF2, and CF3 matching the colors of each pixel PXL. The color filters CF1, CF2, and CF3 may match the colors of the first to third pixels PXL1, PXL2, and PXL3, respectively, and the full-color image may be displayed.

The color filter layer CFL may include a first color filter CF1, a second color filter CF2, and a third color filter CF3. The first color filter CF1 may be disposed in the first pixel PXL1 and selectively transmit light emitted from the first pixel PXL1. The second color filter CF2 may be disposed in the second pixel PXL2 and selectively transmit light emitted from the second pixel PXL2. The third color filter CF3 may be disposed in the third pixel PXL3 and selectively transmit light emitted from the third pixel PXL3.

In an embodiment, the first color filter CF1, the second color filter CF2, and the third color filter CF3 may be a red color filter, a green color filter, and a blue color filter, respectively, but are not limited thereto. Hereinafter, in case that any color filter among the first color filter CF1, the second color filter CF2, and the third color filter CF3 is referred to, or two or more types of color filters are collectively referred to, the any color filter or the two or more types of color filters is referred to as a "color filter CF" or "color filters CF".

The first color filter CF1 may overlap the first color conversion layer CCL1 in the third direction (e.g., in the Z-axis direction). The first color filter CF1 may include a color filter material that selectively transmits the light of the first color (or red). For example, in case that the first pixel PXL1 is the red pixel, the first color filter CF1 may include a red color filter material.

The second color filter CF2 may overlap the second color conversion layer CCL2 in the third direction (e.g., in the Z-axis direction). The second color filter CF2 may include a color filter material that selectively transmits the light of the second color (or green). For example, in case that the second pixel PXL2 is the green pixel, the second color filter CF2 may include a green color filter material.

The third color filter CF3 may overlap the scattering layer LSL in the third direction (e.g., in the Z-axis direction). The third color filter CF3 may include a color filter material that selectively transmits the light of the third color (or blue). For example, in case that the third pixel PXL3 is the blue pixel, the third color filter CF3 may include a blue color filter material.

A light blocking layer BM may be disposed on the color conversion layer CCL. The light blocking layer BM may be disposed between the first to third pixels PXL1, PXL2, and PXL3, and may at least partially overlap each of the first to third pixels PXL1, PXL2, and PXL3. The light blocking layer BM may prevent a color mixture defect visually recognized from a front or side of the display device. A material of the light blocking layer BM is not limited thereto, and may be formed of various light blocking materials. According to an embodiment, the light blocking layer BM may be implemented by stacking the first to third color filters CF1, CF2, and CF3 on each other, but is not limited thereto.

An overcoat layer OC may be disposed on the color filter layer CFL and the light blocking layer BM. The overcoat layer OC may be provided over the first to third pixels PXL1, PXL2, and PXL3. The overcoat layer OC may cover a lower member including the color filter layer CFL. The overcoat layer OC may prevent moisture or air from permeating into the above-described lower member. The overcoat layer OC may protect the above-described lower member from a foreign substance such as dust.

The overcoat layer OC may include at least one organic material of an acrylates resin, an epoxy resin, a phenolic resin, a polyamides resin, a polyimides resin, a polyesters resin, a polyphenylenesulfides resin, and benzocyclobutene (BCB). However, the disclosure is not limited thereto. For example, the overcoat layer OC may include various types of inorganic materials including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A method of manufacturing the display device according to the above-described embodiment is described.

FIGS. 11 to 21 are schematic plan views for each process step of a method of manufacturing a display device according to an embodiment. FIGS. 11 to 21 schematically show a cross-sectional structure of the display device of FIG. 6 or 8. Hereinafter, substantially the same components as those in FIG. 6 or 8 are denoted by the same reference numerals, and thus detailed description of the same constituent elements is omitted.

Figure 11:
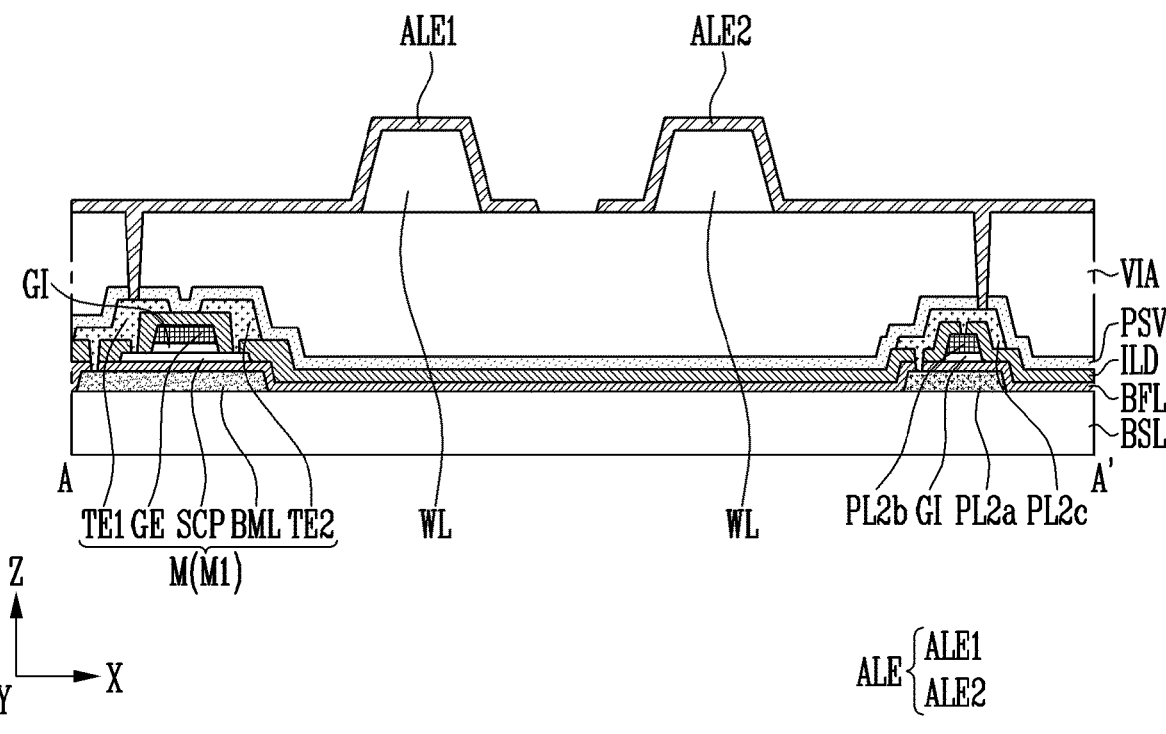
FIGS. 11 to 21 are schematic plan views for each process step of a method of manufacturing a display device according to an embodiment.
Figure 12:
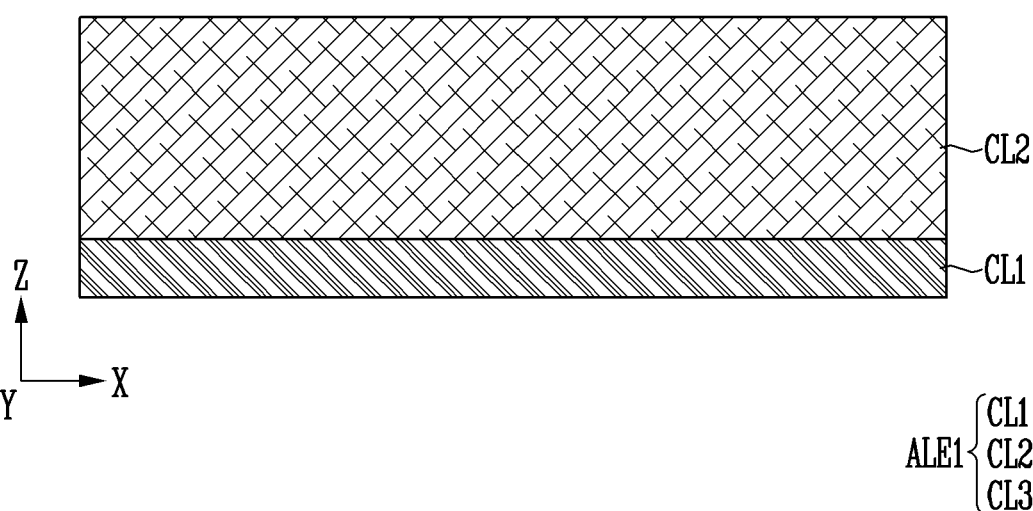
Figure 13:
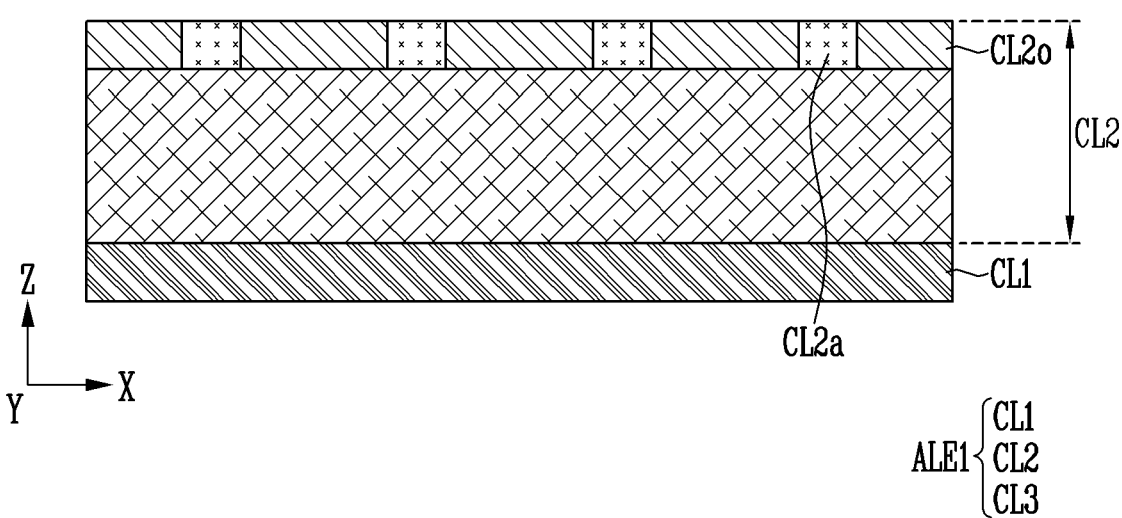
Figure 14:
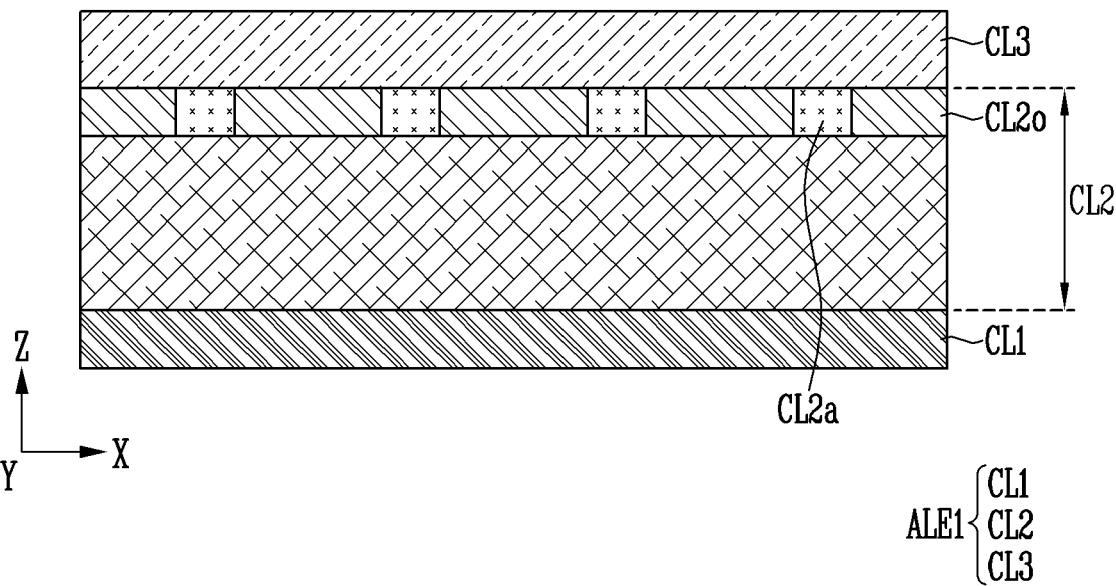

Referring to FIG. 11, the electrodes ALE may be formed on the partition walls WL formed on the circuit element including the transistor M and the via layer VIA. Referring to FIG. 12, the first electrode layer CL1 and the second electrode layer CL2 may be formed to form the first electrode ALE1 (e.g., the electrodes ALE of FIG. 11). The second electrode layer CL2 may be disposed on (e.g., directly disposed or formed) on the first electrode layer CL1. The first electrode layer CL1 may be formed of IZO. For example, the first electrode layer CL1 may include about 10 at % to about 30 at % of Zn and about 70 at % to about 90 at % of In, but is not limited thereto. The second electrode layer CL2 may be formed of an alloy including about 0.5 at % to about 1.0 at % of Ni, about 0.3 at % to about 1.0 at % of La, about 0.5 at % to about 1.0 at % of Cu, and a balance of Al, but is not limited thereto. Referring to FIG. 13, heat may be applied or heat treatment may be performed to form the Al—Ni—Cu precipitate CL2a on the surface of the second electrode layer CL2. For example, the Al—Ni—Cu precipitate CL2a may form fine crystals and be distributed in the aluminum oxide layer CL2o formed on the surface of the second electrode layer CL2. A heat treatment process for the second electrode layer CL2 may be performed at a temperature in a range of about 250 to about 350° C., but is not limited thereto. Referring to FIG. 14, the third electrode layer CL3 may be formed on the second electrode layer CL2. The third electrode layer CL3 may be disposed (e.g., directly disposed or formed) on the second electrode layer CL2. The third electrode layer CL3 may be formed of IZO. For example, the third electrode layer CL3 may include about 10 at % to about 30 at % of Zn and about 70 at % to about 90 at % of In, but is not limited thereto.

Figure 15:
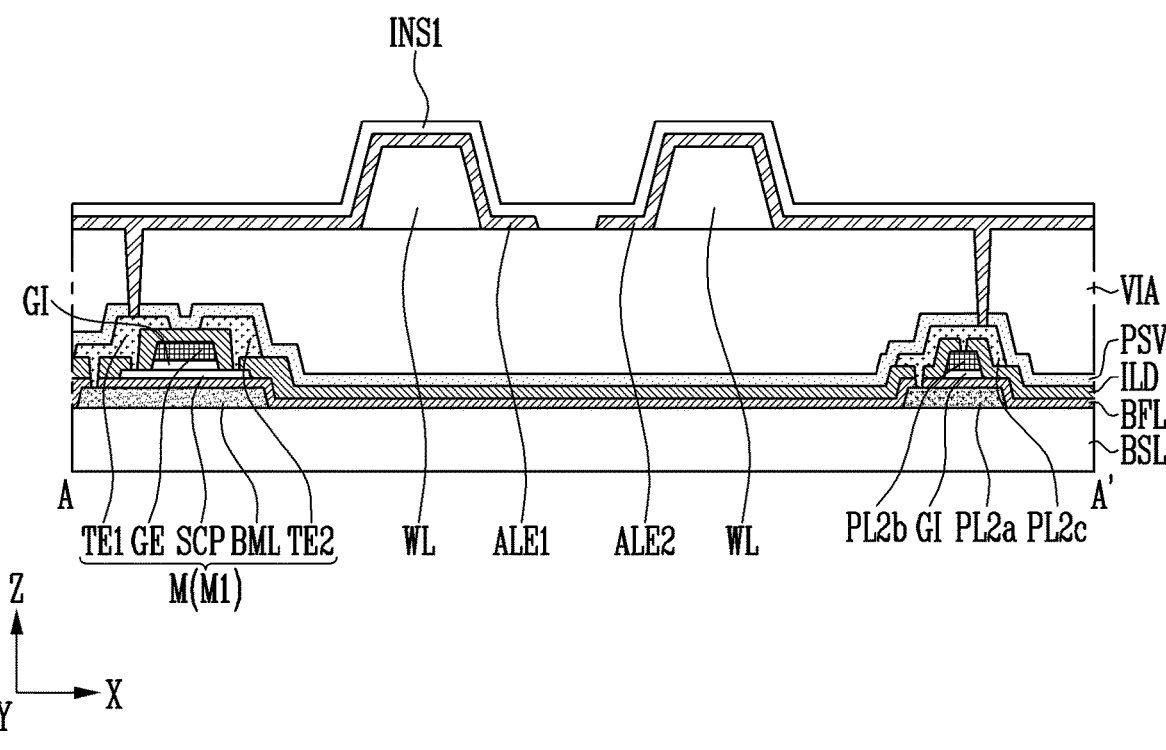
Figure 16:
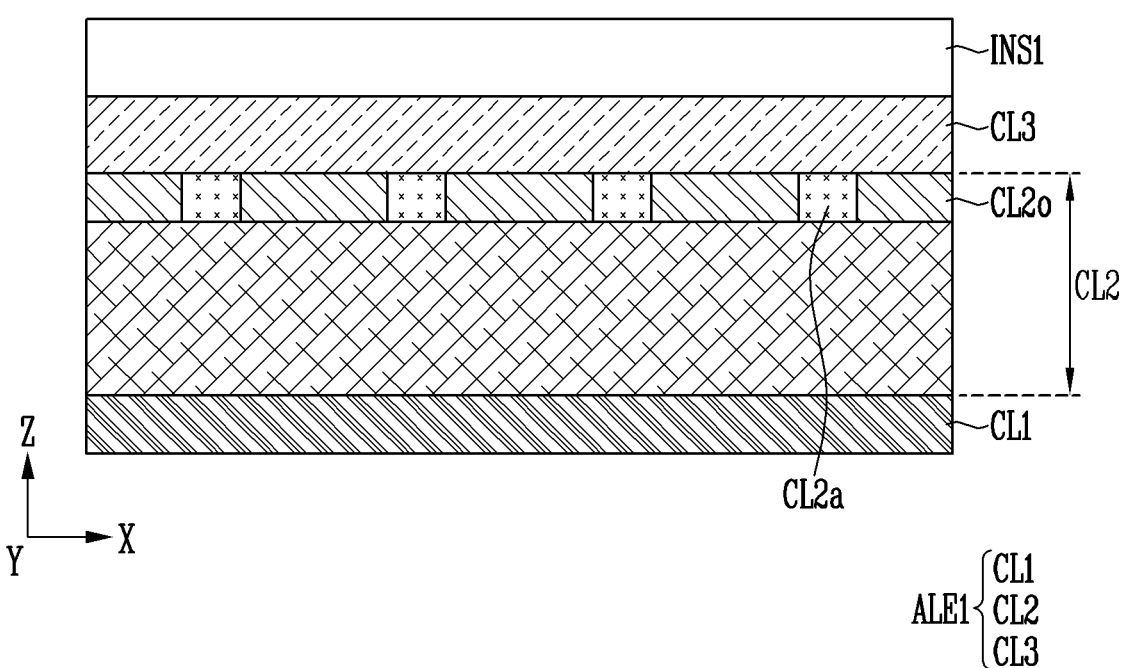

Referring to FIG. 15, the first insulating layer INS1 may be formed on the electrodes ALE. Referring to FIG. 16, in a process of forming the first insulating layer INS1, the second electrode layer CL2 of the electrodes ALE may be protected (or covered) by the third electrode layer CL3.

Figure 17:
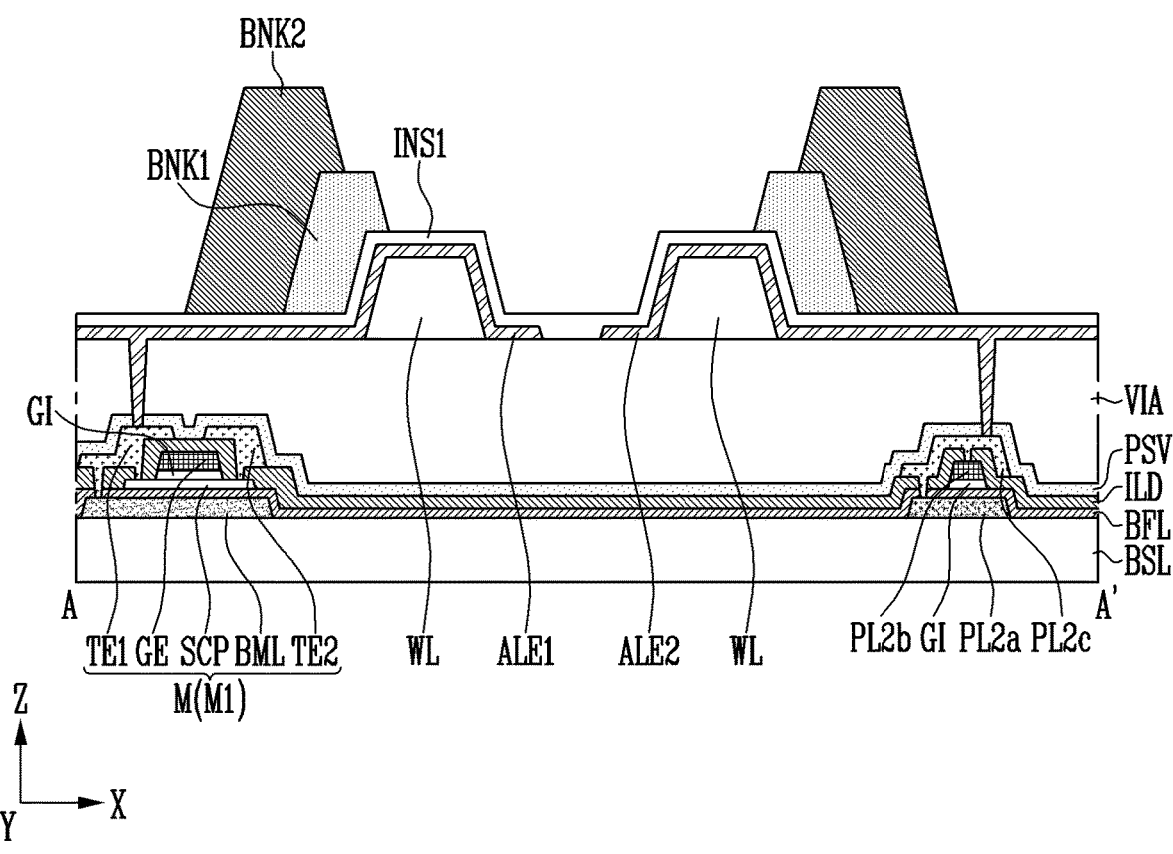

Referring to FIG. 17, the first bank BNK1 and/or the second bank BNK2 may be formed on the first insulating layer INS1. In a process of forming the first bank BNK1 and/or the second bank BNK2, the second electrode layer CL2 of the electrodes ALE may be protected (or covered) by the third electrode layer CL3. Accordingly, the second electrode layer CL2 may be prevented from being damaged by the etchant in a process of etching the first bank BNK1 and/or the second bank BNK2.

Figure 18:
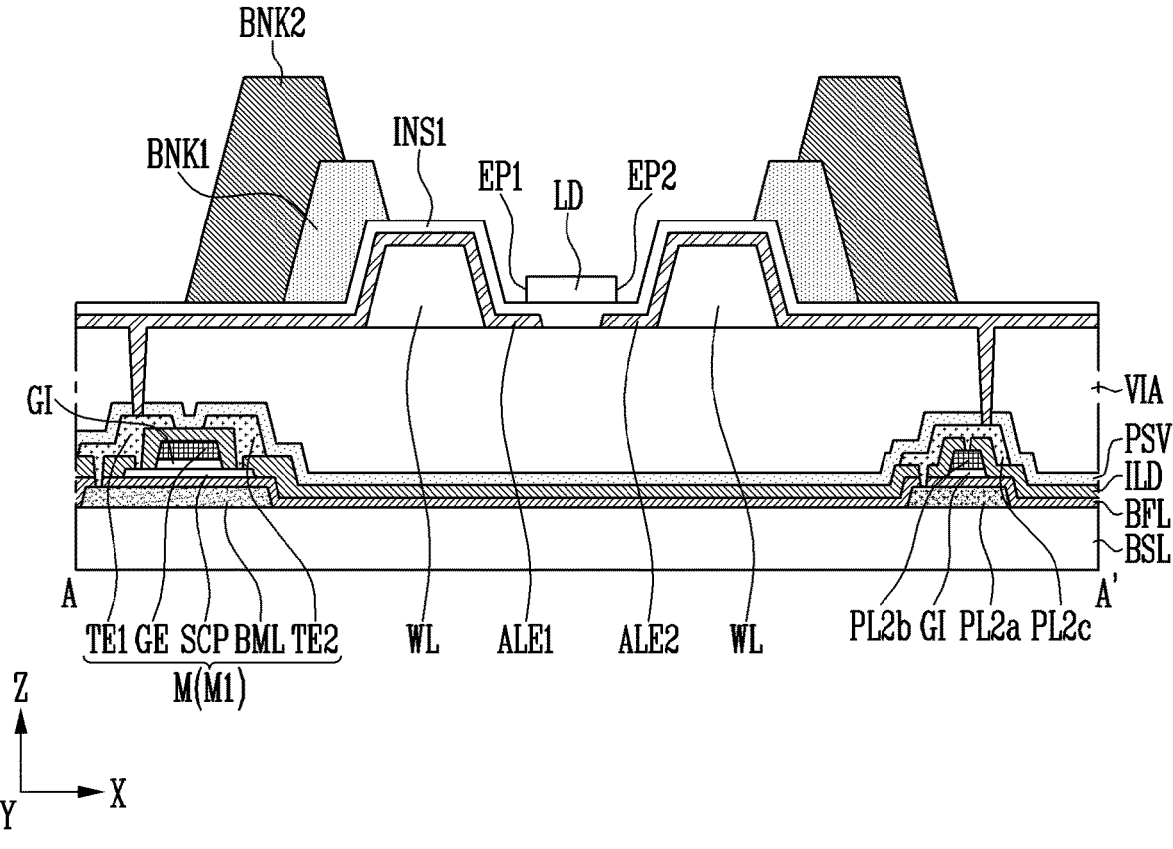

Referring to FIG. 18, the light emitting element LD is provided on the first insulating layer INS1. The light emitting element LD may be provided in the opening of the first bank BNK1 and disposed between the partition walls WL on the first insulating layer INS1. The light emitting elements LD may be dispersed in a light emitting element ink and supplied to each of the pixels PXL through an inkjet printing method or the like. For example, the light emitting elements LD may be dispersed in a volatile solvent and provided to each of the pixels PXL. In case that an alignment signal is supplied to the electrodes ALE, an electric field may be formed between the electrodes ALE (e.g., the first and second electrodes ALE1 and ALE2), and the light emitting elements LD may be aligned between the electrodes ALE. After the light emitting elements LD are aligned, the solvent may be evaporated (or removed by other methods), and the light emitting elements LD may be stably arranged between the electrodes ALE.

Figure 19:
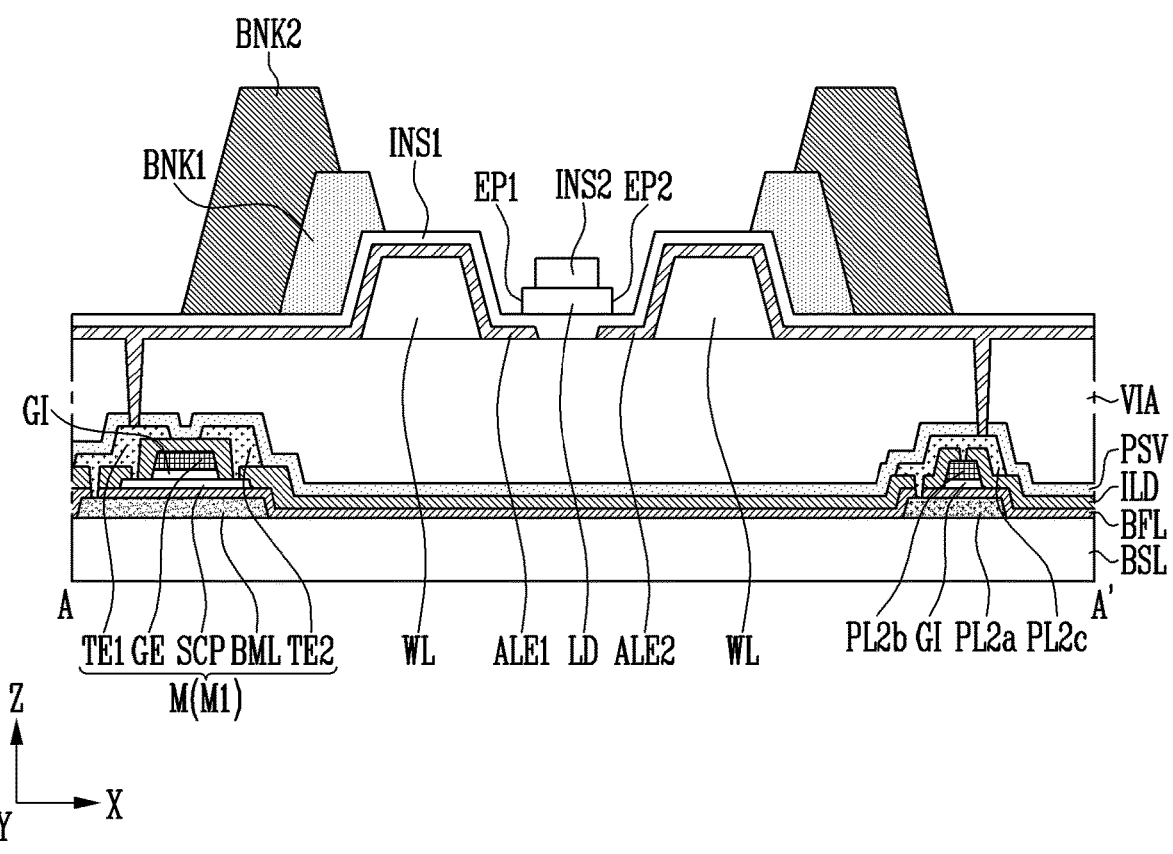

Referring to FIG. 19, the second insulating layer INS2 may be formed on the light emitting element LD. The second insulating layer INS2 may expose the first end EP1 and the second end EP2 of the light emitting element LD. The second electrode layer CL2 (e.g., refer to FIG. 16) of the electrodes ALE may be protected (or covered) by the third electrode layer CL3 in a process of forming the second insulating layer INS2.

Figure 20:
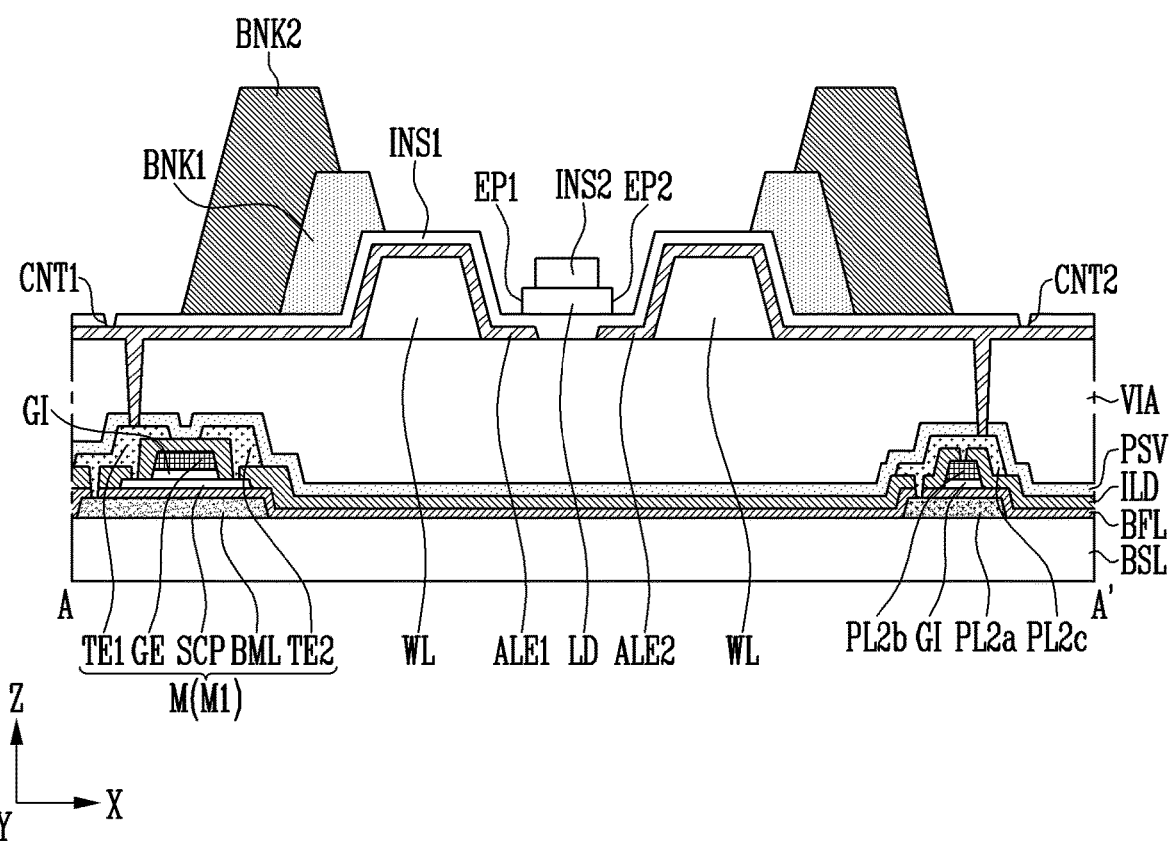
Figure 21:
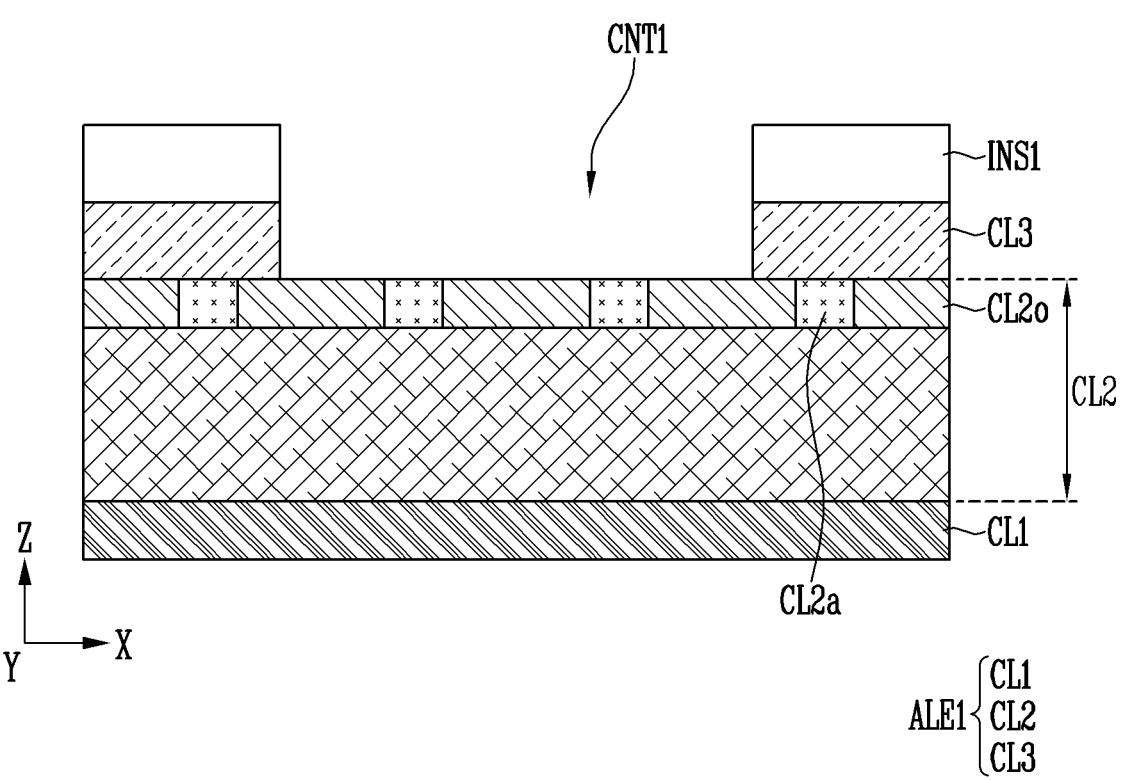

Referring to FIGS. 20 and 21, the first contact hole CNT1 may be formed in the first insulating layer INS1 and the third electrode layer CL3. The first contact hole CNT1 may pass through the first insulating layer INS1 and the third electrode layer CL3 and expose the surface of the second electrode layer CL2. As described above, in case that the surface of the second electrode layer CL2 includes the Al—Ni—Cu precipitate CL2a, galvanic corrosion may be prevented. Thus, the contact resistance with the connection electrode ELT may be minimized.

The connection electrode ELT (e.g., the first to fifth connection electrodes ELT1, ELT2, ELT3, ELT4, and ELT5 of FIGS. 6 and 7) may be formed on the light emitting element LD, and thus the display device shown in FIGS. 6 and 8 may be formed. The connection electrode ELT may contact the first end EP1 or the second end EP2 of the light emitting element LD exposed by the second insulating layer INS2.

According to the method of manufacturing the display device described above, the second electrode layer CL2 may be covered by the third electrode layer CL3, and thus the second electrode layer CL2 may be prevented from being damaged by the etchant in a process of etching the first insulating layer INS1, the first bank BNK1, and the like, which is a subsequent process.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
electrodes spaced apart from each other;
a first insulating layer disposed on the electrodes;
a light emitting element disposed on the first insulating layer; and
a connection electrode contacting the light emitting element on the light emitting element, wherein
the electrodes include:
    a first electrode layer;
    a second electrode layer; and
    a third electrode layer,
the first electrode layer, the second electrode layer, and the third electrode layer are sequentially stacked,
the second electrode layer includes an Al—Ni—Cu precipitate on a surface of the second electrode layer, and
the connection electrode contacts the surface of the second electrode layer through a contact hole formed in the third electrode layer.

2. The display device according to claim 1, wherein the first electrode layer and the third electrode layer include a same material.

3. The display device according to claim 1, wherein the first electrode layer and the third electrode layer include IZO.

4. The display device according to claim 1, wherein the second electrode layer includes about 0.5 at % to about 1.0 at % of Ni, about 0.3 at % to about 1.0 at % of La, about 0.5 at % to about 1.0 at % of Cu, and a balance of Al.

5. The display device according to claim 1, wherein the connection electrode includes ITO.

6. The display device according to claim 1, wherein the connection electrode contacts the surface of the second electrode layer through a contact hole formed in the first insulating layer.

7. The display device according to claim 6, further comprising:
a second insulating layer disposed on the light emitting element,
wherein the connection electrode contacts an end of the light emitting element exposed by the second insulating layer.

8. The display device according to claim 1, wherein the second electrode layer further includes an aluminum oxide film on the surface of the second electrode layer.

9. The display device according to claim 1, wherein a thickness of the first electrode layer and the third electrode layer is in a range of about 50 Å to about 150 Å.

10. The display device according to claim 1, wherein a thickness of the second electrode layer is in a range of about 1,000 Å to about 2,000 Å.

11. A method of manufacturing a display device, the method comprising:
forming a first electrode layer and a second electrode layer and applying heat;
forming a third electrode layer on the second electrode layer;
forming a first insulating layer on the third electrode layer;
providing a light emitting element on the first insulating layer;
forming a contact hole in the third electrode layer and the first insulating layer; and
forming a connection electrode on the light emitting element,
wherein the connection electrode contacts a surface of the second electrode layer through the contact hole.

12. The method according to claim 11, wherein an Al—Ni—Cu precipitate is formed on the surface of the second electrode layer in the applying of the heat.

13. The method according to claim 11, further comprising:
forming a bank on the first insulating layer.

14. The method according to claim 13, wherein the second electrode layer is covered by the third electrode layer in the forming of the bank.

15. The method according to claim 14, wherein the light emitting element is provided in an opening of the bank.

16. The method according to claim 15, wherein the light emitting element is aligned between electrodes including the first electrode layer, the second electrode layer, and the third electrode layer.

17. The method according to claim 11, wherein the second electrode layer is covered by the third electrode layer in the forming of the first insulating layer.

18. The method according to claim 11, further comprising:
forming a second insulating layer on the light emitting element,
wherein the second electrode layer is covered by the third electrode layer in the forming of the second insulating layer.

19. The method according to claim 18, wherein the connection electrode contacts an end of the light emitting element exposed by the second insulating layer.

20. The method according to claim 11, wherein the second electrode layer is formed of an alloy including about 0.5 at % to about 1.0 at % of Ni, about 0.3 at % to about 1.0 at % of La, about 0.5 at % to about 1.0 at % of Cu, and a balance of Al.

\* \* \* \* \*